(12) United States Patent
Yoshida et al.

(10) Patent No.: US 10,847,314 B2
(45) Date of Patent: Nov. 24, 2020

(54) MULTILAYER CAPACITOR AND ELECTRONIC COMPONENT DEVICE

(71) Applicant: TDK CORPORATION, Tokyo (JP)

(72) Inventors: Takeru Yoshida, Tokyo (JP); Takuya Imaeda, Tokyo (JP); Shogo Murosawa, Tokyo (JP); Hideki Kamo, Tokyo (JP); Naoto Imaizumi, Tokyo (JP); Keiichi Takizawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/875,617

(22) Filed: Jan. 19, 2018

(65) Prior Publication Data

US 2018/0226191 A1 Aug. 9, 2018

(30) Foreign Application Priority Data

Jan. 20, 2017 (JP) .................... 2017-008638
Aug. 30, 2017 (JP) .................... 2017-166020
Aug. 30, 2017 (JP) .................... 2017-166022

(51) Int. Cl.
  *H01G 4/002* (2006.01)
  *H01G 4/012* (2006.01)
  (Continued)

(52) U.S. Cl.
  CPC ............. *H01G 4/002* (2013.01); *H01G 4/012* (2013.01); *H01G 4/232* (2013.01); *H01G 4/248* (2013.01);
  (Continued)

(58) Field of Classification Search
  CPC ........ H01G 4/002; H01G 4/012; H01G 4/232; H01G 4/248; H01G 4/30; H01G 4/1227;
  (Continued)

(56) References Cited

U.S. PATENT DOCUMENTS 5,032,815 A * 7/1991 Kobayashi .......... H01F 17/0013
  336/172
5,040,092 A 8/1991 Katho et al.
(Continued)

FOREIGN PATENT DOCUMENTS

CN   104112595 A   10/2014
CN   105097281 A   11/2015
(Continued)

OTHER PUBLICATIONS

Jul. 10, 2019 Office Action Issued in U.S. Appl. No. 16/255,041.

*Primary Examiner* — Timothy J Thompson
*Assistant Examiner* — Guillermo J Egoavil
(74) *Attorney, Agent, or Firm* — Oliff PLC

(57) ABSTRACT

A multilayer capacitor includes an element assembly, a first external electrode, a second external electrode, and a plurality of internal electrodes which are disposed at the inside of the element assembly. The plurality of internal electrodes include a first internal electrode that is electrically connected to the first external electrode, a second internal electrode that is electrically connected to the second external electrode, and a plurality of third internal electrodes. The plurality of third internal electrodes are electrically connected to each other by a first connection conductor and a second connection conductor, a first capacitance portion is constituted by the first internal electrode and the third internal electrodes, a second capacitance portion is constituted by the second internal electrode and the third internal electrodes, and the first capacitance portion and the second capacitance portion are electrically connected in series.

26 Claims, 22 Drawing Sheets

(51) Int. Cl.
*H01G 4/248* (2006.01)
*H01G 4/30* (2006.01)
*H05K 1/18* (2006.01)
*H05K 1/11* (2006.01)
*H01G 4/38* (2006.01)
*H01G 4/232* (2006.01)
*H05K 3/34* (2006.01)

(52) U.S. Cl.
CPC ............. *H01G 4/30* (2013.01); *H01G 4/385* (2013.01); *H05K 1/111* (2013.01); *H05K 1/115* (2013.01); *H05K 1/181* (2013.01); *H05K 3/3442* (2013.01); *H05K 2201/09781* (2013.01); *H05K 2201/10015* (2013.01)

(58) Field of Classification Search
CPC .......... H01G 2/065; H01G 4/385; H05K 1/18; H05K 1/111; H05K 1/115; H05K 1/181; H05K 2201/09781; H05K 2201/10015; H05K 3/3442
USPC ........................................ 174/260; 361/321.1
See application file for complete search history.

(56) References Cited

U.S. PATENT DOCUMENTS

| | | | |
|---|---|---|---|
| 5,251,108 A * | 10/1993 | Doshita | H01F 17/0013 336/200 |
| 6,336,365 B1 * | 1/2002 | Blackadar | G01P 15/0922 73/514.34 |
| 8,056,199 B2 * | 11/2011 | Aoki | H01G 4/30 29/25.42 |
| 9,142,344 B2 * | 9/2015 | Tachibana | H01F 27/2804 |
| 2009/0244807 A1 | 10/2009 | Lee et al. | |
| 2010/0127812 A1 * | 5/2010 | Maeda | H01F 17/0013 336/200 |
| 2013/0062994 A1 * | 3/2013 | Ogawa | H01G 4/30 310/311 |
| 2014/0311787 A1 * | 10/2014 | Park | H01G 2/065 174/260 |
| 2015/0325371 A1 * | 11/2015 | Hattori | H01G 4/248 361/301.4 |

FOREIGN PATENT DOCUMENTS

| | | |
|---|---|---|
| JP | H03-073421 U | 7/1991 |
| JP | H07-135124 A | 5/1995 |
| JP | H08-279437 A | 10/1996 |
| JP | 2000-223348 A | 8/2000 |
| JP | 2003-077775 A | 3/2003 |
| JP | 2013-131548 A | 7/2013 |
| JP | 2014-216640 A | 11/2014 |

\* cited by examiner

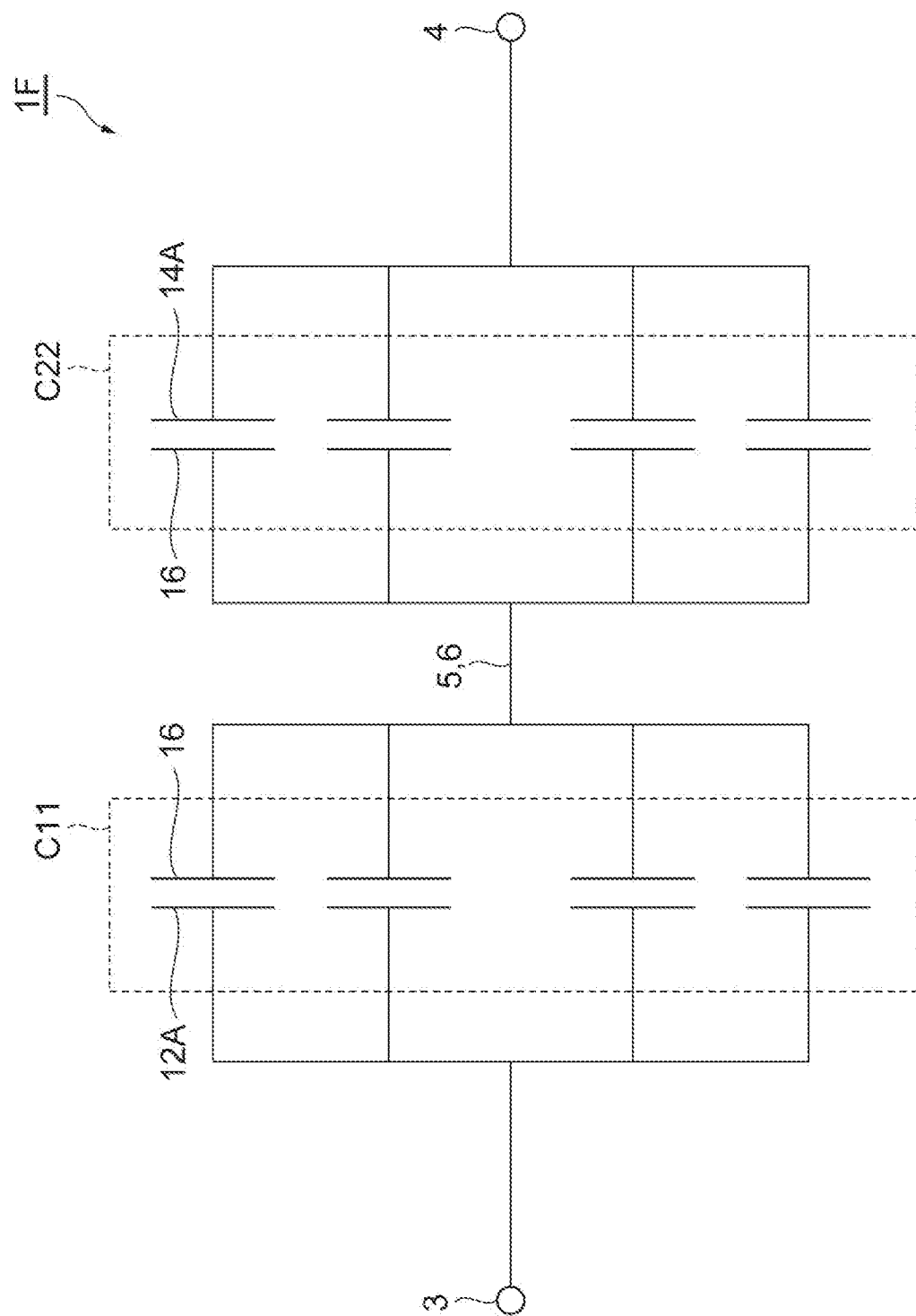

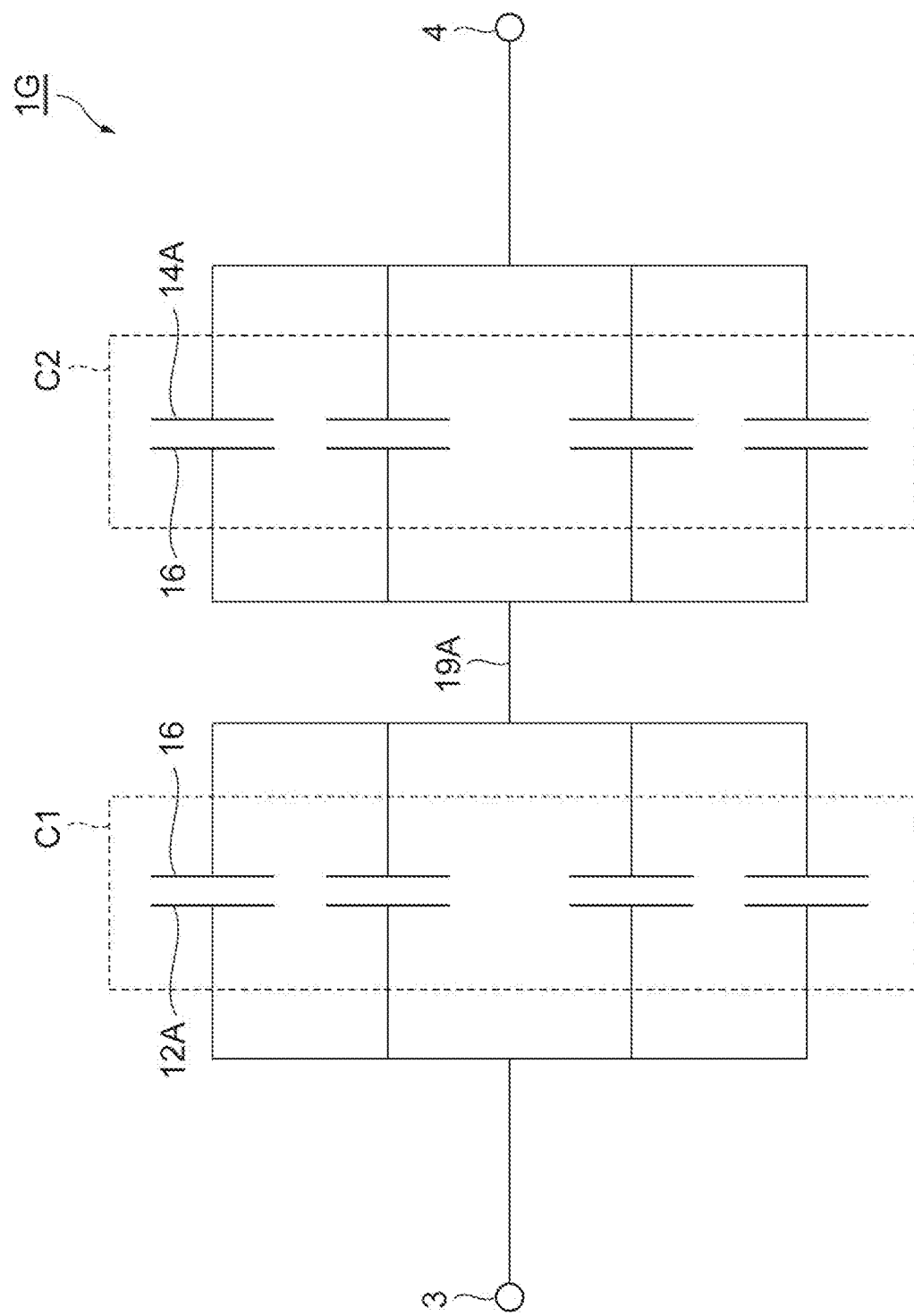

MULTILAYER CAPACITOR AND ELECTRONIC COMPONENT DEVICE

TECHNICAL FIELD

The present invention relates to a multilayer capacitor and an electronic component device.

BACKGROUND

As a multilayer capacitor in the related art, for example, a multilayer capacitor described in Japanese Unexamined Patent Publication No. H7-135124 is known. The multilayer capacitor described in Japanese Unexamined Patent Publication No. H7-135124 is a lamination-type ceramic capacitor in which a plurality of dielectric layers with an electrode pattern disposed on a surface thereof are stacked, and a plurality of capacitor components which are connected in parallel are formed on an inner side. Parts of the electrode patterns arranged on the ceramic dielectric layers are divided into a plurality of pieces so that each of the capacitor components which are connected in parallel is formed by connecting at least two capacitor components in series.

SUMMARY

In the multilayer capacitor of the related art, at least two capacitor components are connected in series to realize an improvement in a withstand voltage property. However, in the multilayer capacitor of the related art, for example, even in a case where a problem such as short-circuiting occurs in one capacitor component between the capacitor components which are connected in parallel, the other capacitor component is not influenced by the problem. Therefore, in the multilayer capacitor of the related art, even in a case where a problem occurs in the capacitor component, electrostatic capacitance and a withstand voltage are secured. Accordingly, even though a problem occurs after mounting, it is difficult to detect the problem.

An object of an aspect of the invention is to provide a multilayer capacitor and an electronic component device which are capable of detecting occurrence of a problem while realizing an improvement in a withstand voltage property.

According to an aspect of the invention, there is provided a multilayer capacitor including: an element assembly including a pair of end surfaces which are opposite to each other, a pair of main surfaces which are opposite to each other, and a pair of lateral surfaces which are opposite to each other; a first external electrode and a second external electrode which are respectively disposed on pair-of-end-surface sides; and a plurality of internal electrodes which are disposed in the element assembly. The plurality of internal electrodes include a first internal electrode that is electrically connected to the first external electrode, a second internal electrode that is electrically connected to the second external electrode, and a plurality of third internal electrodes, the plurality of third internal electrodes are electrically connected to each other by a connection conductor, a first capacitance portion is constituted by the first internal electrode and the third internal electrodes, a second capacitance portion is constituted by the second internal electrode and the third internal electrodes, and the first capacitance portion and the second capacitance portion are electrically connected in series.

In the multilayer capacitor according to the aspect of the invention, the first capacitance portion is constituted by the first internal electrode that is electrically connected to the first external electrode, and the third internal electrodes, and the second capacitance portion is constituted by the second internal electrode that is connected to the second external electrode, and the third internal electrodes. The plurality of third internal electrodes are electrically connected to each other by a connection conductor. According to this, the multilayer capacitor has a configuration in which two capacitor components are connected in series. Accordingly, in the multilayer capacitor, an improvement in a withstand voltage property is realized. In addition, in the multilayer capacitor, the first capacitance portion and the second capacitance portion are connected in series by the plurality of third internal electrodes which are electrically connected to each other by the connection conductor. Accordingly, for example, in a case where a problem occurs in the first capacitance portion, a variation occurs in electrostatic capacitance and a resistance value. As a result, in the multilayer capacitor, even when a problem occurs after mounting, it is possible to detect the problem.

In an embodiment, the first internal electrode and the second internal electrode may be disposed at the same position in an opposing direction of the pair of main surfaces, and the third internal electrodes may be disposed to be respectively opposite to the first internal electrode and the second internal electrode. In this configuration, the first capacitance portion is constructed in a region on one end surface side, and the second capacitance portion is constructed in a region on the other end surface side. According to this, in the multilayer capacitor, even in a case where bending occurs in the element assembly, and cracks occur in the element assembly from main surface sides, for example, the second internal electrode disposed on the other end surface side may be broken, but it is possible to avoid breakage of the first internal electrode disposed on one end surface side. Accordingly, in the multilayer capacitor, it is possible to protect the first capacitance portion. As described above, in the multilayer capacitor, even in a case where cracks occur in the element assembly, it is possible to protect a part of the capacitance portions.

When the multilayer capacitor is mounted on a circuit substrate and the like, cracks may occur in the element assembly. The cracks may occur in a state in which the external electrode, which is disposed on a mounting surface side of the element assembly mounted on the circuit substrate, is set as a base point. In a multilayer capacitor of the related art, two electrode patterns, which are electrically connected to external electrodes different from each other, are disposed on one dielectric layer. In this configuration, in a case where cracks occur from both sides of the two external electrodes, both of the two electrode patterns disposed on a mounting surface side may be broken. Therefore, in the multilayer capacitor of the related art, a problem may occur in the entirety of capacitor components.

In an embodiment, the first internal electrode may be disposed on one main surface side at the inside of the element assembly, the second internal electrode may be disposed on the other main surface side at the inside of the element assembly, and the third internal electrodes may be disposed to be respectively opposite to the first internal electrode and the second internal electrode. In this configuration, the first capacitance portion is constructed in a region on the one main surface side, and the second capacitance portion is constructed in a region on the other main surface side. According to this, in the multilayer capacitor, in a case where the multilayer capacitor is mounted in a state in which the other main surface is set as the mounting surface, even in a case where cracks occur in the element assembly from both of the first external electrode side and the second external electrode side, the second internal electrode may be broken, but it is possible to avoid breakage of the first internal electrode disposed on the one main surface side. Accordingly, in the multilayer capacitor, it is possible to protect the first capacitance portion. As described above, in the multilayer capacitor, even in a case where cracks occur in the element assembly, it is possible to protect a part of the capacitance portions.

In an embodiment, a pair of the third internal electrodes may be disposed to be opposite to each other between the first internal electrode and the second internal electrode. In this configuration, a capacitance portion is not formed between the first capacitance portion and the second capacitance portion. Accordingly, it is possible to easily realize a configuration in which the first capacitance portion and the second capacitance portion are electrically connected in series.

In an embodiment, the third internal electrodes may be further disposed between the pair of third internal electrodes disposed to be opposite to each other. In this configuration, for example, even in a case where breakage occurs in the first internal electrode that constitutes the first capacitance portion, it is possible to suppress the breakage from propagating to the second internal electrode that constitutes the second capacitance portion due to the third internal electrodes. As a result, in the multilayer capacitor, even in a case where cracks occur in the element assembly, it is possible to protect a part of the capacitance portions.

In an embodiment, the multilayer capacitor may include a dummy electrode that is disposed at the same layer as a layer of at least one internal electrode among the first internal electrode, the second internal electrode, and the third internal electrodes to be spaced away from the internal electrode, and is connected to an external electrode different from the first external electrode or the second external electrode to which the internal electrode is connected. In this configuration, the external electrodes and the dummy electrode are joined to each other, it is possible to secure joining strength between the element assembly, and the first external electrode and/or the second external electrode.

In an embodiment, the first capacitance portion may be constituted by the first internal electrode and the third internal electrodes which are disposed in a region on the one main surface side at the inside of the element assembly, the second capacitance portion may be constituted by the second internal electrode and the third internal electrodes which are disposed in a region on the other main surface side at the inside of the element assembly, an isolation portion may be provided between the first capacitance portion and the second capacitance portion in the opposing direction of the pair of main surfaces to isolate the first capacitance portion and the second capacitance portion, and electric field intensity at the isolation portion may be smaller than electric field intensity of the first internal electrode and the third internal electrodes at the first capacitance portion, and electric field intensity of the second internal electrode and the third internal electrodes at the second capacitance portion. In this configuration, it is possible to further suppress occurrence of insulating breakage and the like between the first capacitance portion and the second capacitance portion. As a result, in the multilayer capacitor, it is possible to further realize an improvement in the withstand voltage property.

In an embodiment, the isolation portion may be disposed between the pair of third internal electrodes which are opposite to each other in the opposing direction. In this configuration, since the isolation portion is provided between the third internal electrodes which are electrically connected to each other, it is possible to set electric field intensity at the isolation portion to zero. Accordingly, it is possible to further suppress occurrence of insulating breakage and the like between the first capacitance portion and the second capacitance portion. As a result, it is possible to further realize an improvement in the withstand voltage property.

In an embodiment, the other main surface of the element assembly may be a mounting surface, the connection conductor may be disposed on pair-of-lateral-surface sides of the element assembly, each of the first external electrode, the second external electrode, and the connection conductor may include an electrode portion that is disposed on the mounting surface, and the thickness of the electrode portion of the connection conductor in the opposing direction may be smaller than the thickness of the electrode portion of each of the first external electrode and the second external electrode in the opposing direction. In this configuration, when the multilayer capacitor is mounted on a circuit substrate and the like, the thickness of the electrode portion of the first external electrode and the second external electrode is large, and thus it is possible to suppress the electrode portion of the connection conductor from coming into contact with the circuit substrate and the like. Accordingly, it is possible to suppress the first external electrode and/or the second external electrode and the connection conductor from being electrically connected to each other. As a result, in the multilayer capacitor according to the embodiment, it is possible to realize a configuration in which the first capacitance portion and the second capacitance portion are connected in series.

In an embodiment, when a distance between an edge, which is located on an inner side in an opposing direction of the pair of end surfaces, of the electrode portion of each of the first external electrode and the second external electrode, and an end surface, on which the first external electrode or the second external electrode that includes the electrode portion is disposed, in the pair of end surfaces is set as BL, and a distance between the mounting surface and the first capacitance portion is set as GL, a relationship of BL<GL×0.36 may be satisfied. In a case of mounting the multilayer capacitor on a circuit substrate and the like, when the circuit substrate is bent, cracks may occur in the element assembly from a position corresponding to the edge of the electrode portion of the first external electrode and/or the second external electrode. The cracks may occur at a predetermined angle from the position corresponding to the edge of the electrode portion. In the multilayer capacitor according to the embodiment, the relationship of BL<GL×0.36 is satisfied. Accordingly, even in a case where cracks occur in the element assembly, it is possible to suppress the cracks from reaching the first capacitance portion. Accordingly, it is possible to suppress the cracks from having an effect on the first capacitance portion. As a result, in the multilayer capacitor according to the embodiment, even in a case where cracks occur in the element assembly, it is possible to protect a part of the capacitance portions.

According to another aspect of the invention, there is provided an electronic component device including: a circuit substrate including an electrical circuit; and a multilayer capacitor that is mounted on the circuit substrate. The multilayer capacitor includes an element assembly including a pair of end surfaces which are opposite to each other, a pair of main surfaces which are opposite to each other, and a pair of lateral surfaces which are opposite to each other, a first external electrode and a second external electrode which are respectively disposed on pair-of-end-surface sides, and a plurality of internal electrodes which are disposed in the element assembly. The plurality of internal electrodes include a first internal electrode that is electrically connected to the first external electrode, a second internal electrode that is electrically connected to the second external electrode, and a plurality of third internal electrodes, the plurality of third internal electrodes are electrically connected to each other by a connection conductor, a first capacitance portion is constituted by the first internal electrode and the third internal electrodes, a second capacitance portion is constituted by the second internal electrode and the third internal electrodes, only the first external electrode and the second external electrode of the multilayer capacitor are electrically connected to the electrical circuit of the circuit substrate, and in the multilayer capacitor, the first capacitance portion and the second capacitance portion are electrically connected in series.

In the electronic component device according to the aspect of the invention, only the first external electrode and the second external electrode of the multilayer capacitor are electrically connected to the electrical circuit of the circuit substrate. According to the electronic component device, in the multilayer capacitor, the first capacitance portion is constituted by the first internal electrode that is electrically connected to the first external electrode, and the third internal electrodes, and the second capacitance portion is constituted by the second internal electrode that is connected to the second external electrode, and the third internal electrodes. The plurality of third internal electrodes are electrically connected to each other by the connection conductor. According to this, the multilayer capacitor has a configuration in which two capacitor components are connected in series. Accordingly, in the multilayer capacitor, an improvement in a withstand voltage property is realized. In addition, in the multilayer capacitor, the first capacitance portion and the second capacitance portion are connected in series by the plurality of third internal electrodes which are electrically connected to each other by the connection conductor. Accordingly, for example, in a case where a problem occurs in the first capacitance portion, a variation occurs in electrostatic capacitance and a resistance value. Accordingly, in the multilayer capacitor, even when a problem occurs after mounting, it is possible to detect the problem. As a result, in the electronic component device including the multilayer capacitor, it is possible to detect occurrence of a problem while realizing an improvement in the withstand voltage property.

In an embodiment, between one main surface and the other main surface of the element assembly, the other main surface may be a mounting surface, the connection conductor may be disposed at least on one lateral surface side of the element assembly, each of the first external electrode, the second external electrode, and the connection conductor may include an electrode portion that is disposed on the mounting surface, and the thickness of the electrode portion of each of the first external electrode and the second external electrode in an opposing direction of the pair of main surfaces may be greater than the thickness of the electrode portion of the connection conductor in the opposing direction. In this configuration, it is possible to avoid a situation in which the electrode portion of the connection conductor comes into contact with the circuit substrate prior to the electrode portion of the first external electrode and the second external electrode. Accordingly, in the electronic component device, it is possible to stably mount the first external electrode and the second external electrode of the multilayer capacitor on the circuit substrate.

In an embodiment, between one main surface and the other main surface of the element assembly, the other main surface may be a mounting surface, and the connection conductor may be disposed at least on one lateral surface side of the element assembly. In this configuration, the connection conductor is not disposed on the main surface that is the mounting surface. According to this, in the electronic component device, it is possible to avoid a situation in which the connection conductor comes into contact with the circuit substrate on the mounting surface. Accordingly, in the electronic component device, it is possible to stably mount the first external electrode and the second external electrode of the multilayer capacitor on the circuit substrate. In addition, in the electronic component device, it is possible to suppress short-circuiting from occurring between the first external electrode and/or the second external electrode, and the connection conductor.

In an embodiment, the connection conductor may be a via-conductor that is disposed at the inside of the element assembly. In this configuration, the connection conductor is not exposed from the element assembly. According to this, in the electronic component device, it is possible to avoid a situation in which the connection conductor comes into contact with the circuit substrate. Accordingly, in the electronic component device, it is possible to stably mount the first external electrode and the second external electrode of the multilayer capacitor on the circuit substrate. In addition, in the electronic component device, it is possible to suppress short-circuiting from occurring between the first external electrode and/or the second external electrode, and the connection conductor.

In an embodiment, the first internal electrode and the second internal electrode may be disposed at the same position in an opposing direction of the pair of main surfaces, and the third internal electrodes may be disposed to be respectively opposite to the first internal electrode and the second internal electrode. In this configuration, the first capacitance portion is constructed in a region on one end surface side, and the second capacitance portion is constructed in a region on the other end surface side. According to this, in the multilayer capacitor, even when bending occurs in the element assembly, and cracks occur in the element assembly, for example, the second internal electrode disposed on the other end surface side may be broken, but it is possible to avoid breakage of the first internal electrode disposed on the one end surface side. Accordingly, in the multilayer capacitor, it is possible to protect the first capacitance portion. As described above, in the multilayer capacitor, even in a case where cracks occur in the element assembly, it is possible to protect a part of the capacitance portions.

In an embodiment, the first internal electrode may be disposed on one main surface side at the inside of the element assembly, the second internal electrode may be disposed on the other main surface side at the inside of the element assembly, and the third internal electrodes may be disposed to be respectively opposite to the first internal electrode and the second internal electrode. In this configuration, the first capacitance portion is constructed in a region on one main surface side, and the second capacitance portion is constructed in a region on the other main surface side. According to this, in a case where the multilayer capacitor is mounted in a state in which the other main surface is set as a mounting surface, even in a case where cracks occur in the element assembly from both of the first external electrode side and the second external electrode side, the second internal electrode may be broken, but it is possible to avoid breakage of the first internal electrode disposed on the one main surface side. Accordingly, in the multilayer capacitor, it is possible to protect the first capacitance portion. As described above, in the multilayer capacitor, even in a case where cracks occur in the element assembly, it is possible to protect a part of the capacitance portions.

According to the aspect of the invention, it is possible to detect occurrence of a problem while realizing an improvement in the withstand voltage property.

BRIEF DESCRIPTION OF THE DRAWINGS

FIG. 17 is an equivalent circuit diagram of the multilayer capacitor illustrated in FIG. 15;

FIG. 18C is an equivalent circuit diagram of the multilayer capacitor illustrated in FIGS. 18A and 18B;

DETAILED DESCRIPTION

Figure 1:
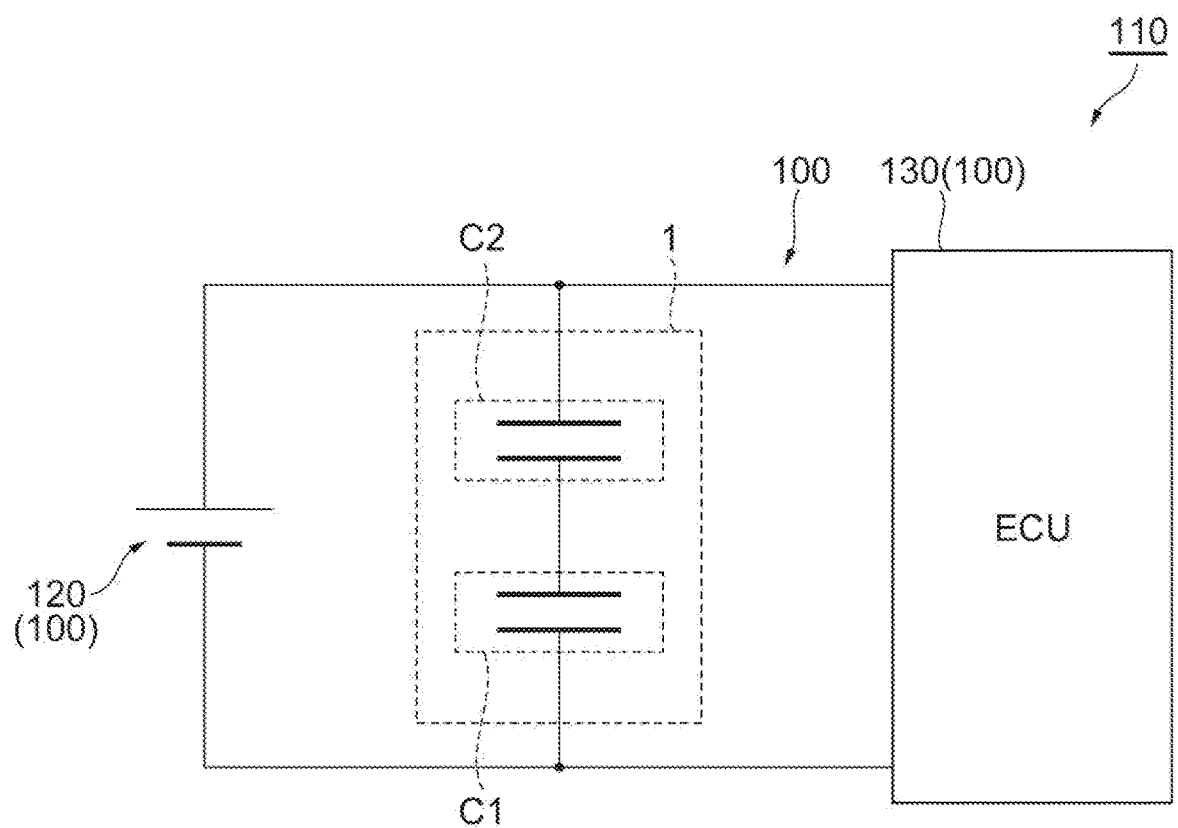
FIG. 1 is a view illustrating an electronic component device according to an embodiment.

Hereinafter, embodiments of the invention will be described in detail with reference to the accompanying drawings. Furthermore, in description of the drawings, the same reference numeral will be given to the same element or an equivalent element, and redundant description thereof will not be repeated.

As illustrated in FIG. 1, an electronic component device 110 includes a multilayer capacitor 1 and a circuit substrate 100.

First Embodiment

As illustrated in FIG. 2, FIG. 3, FIG. 4A, and FIG. 4B, the multilayer capacitor 1 according to the first embodiment includes an element assembly 2, a first external electrode 3, a second external electrode 4, a first connection conductor 5, and a second connection conductor 6 which are disposed on an outer surface of the element assembly 2.

The element assembly 2 has a rectangular parallelepiped shape. The rectangular parallelepiped shape includes a shape of a rectangular parallelepiped in which respective corners and ridgeline portions are chamfered, and a shape of a rectangular parallelepiped in which respective corners and ridgeline portions are rounded. The element assembly 2 includes a pair of end surfaces 2a and 2b which are opposite to each other, a pair of main surfaces 2c and 2d which are opposite to each other, and a pair of lateral surfaces 2e and 2f which are opposite to each other as outer surfaces thereof. An opposing direction in which the main surfaces 2c and 2d as a pair are opposite to each other is a first direction D1. An opposing direction in which the end surfaces 2a and 2b as a pair are opposite to each other is a second direction D2. An opposing direction in which the lateral surface 2e and 2f as a pair are opposite to each other is a third direction D3. In this embodiment, the first direction D1 is a height direction of the element assembly 2. The second direction D2 is a longitudinal direction of the element assembly 2, and is perpendicular to the first direction D1. The third direction D3 is a width direction of the element assembly 2 and is perpendicular to the first direction D1 and the second direction D2.

Figure 8A:
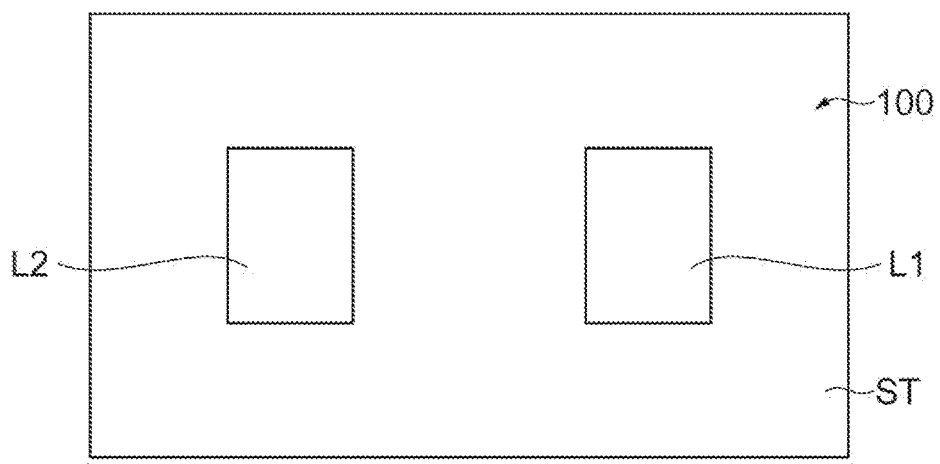
FIG. 8A is a view illustrating a circuit substrate of the electronic component device illustrated in FIG. 1.
Figure 8B:
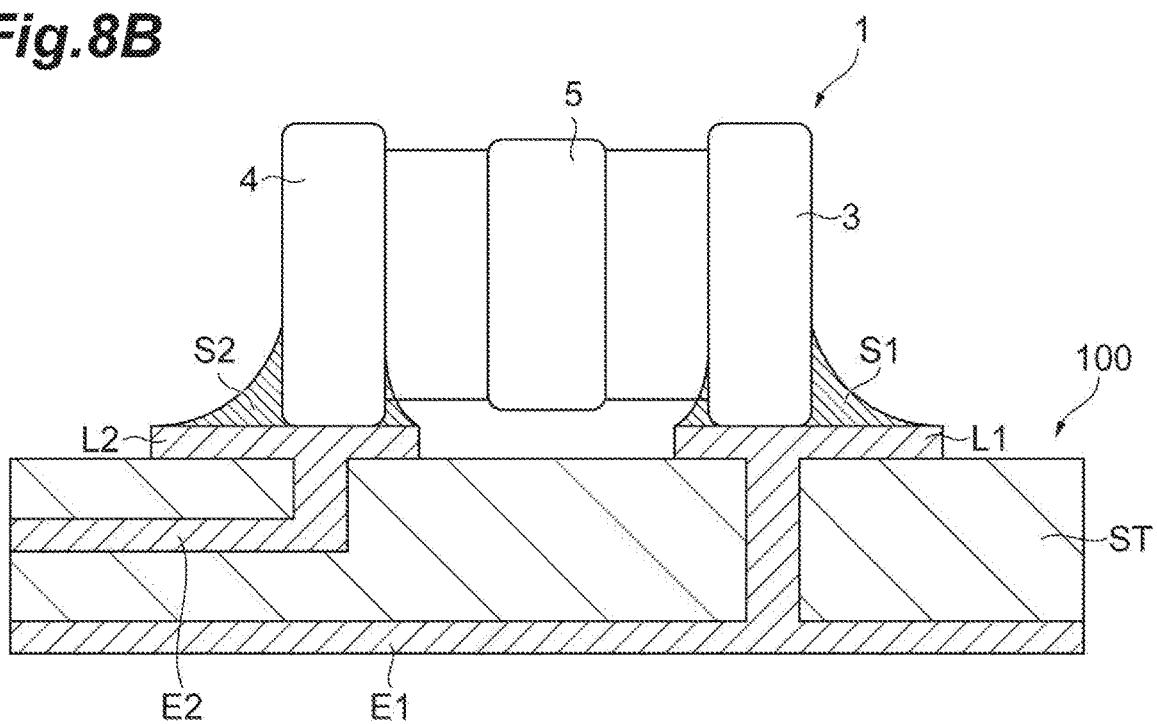
FIG. 8B is a view illustrating a state in which the multilayer capacitor is mounted on the circuit substrate.

The pair of end surfaces 2a and 2b extend in the first direction D1 to connect the pair of main surfaces 2c and 2d. The pair of end surfaces 2a and 2b also extend in the third direction D3 (a short-side direction of the pair of main surfaces 2c and 2d). The pair of lateral surfaces 2e and 2f extends in the first direction D1 to connect the pair of main surfaces 2c and 2d. The pair of lateral surfaces 2e and 2f also extend in the second direction D2 (a long-side direction of the pair of end surfaces 2a and 2b). In this embodiment, as illustrated in FIG. 8B, the main surface 2d is defined as a mounting surface that is opposite to another electronic device when the multilayer capacitor 1 is mounted on the other electronic device (for example, a circuit substrate, a multilayer capacitor, and the like).

Figure 5:
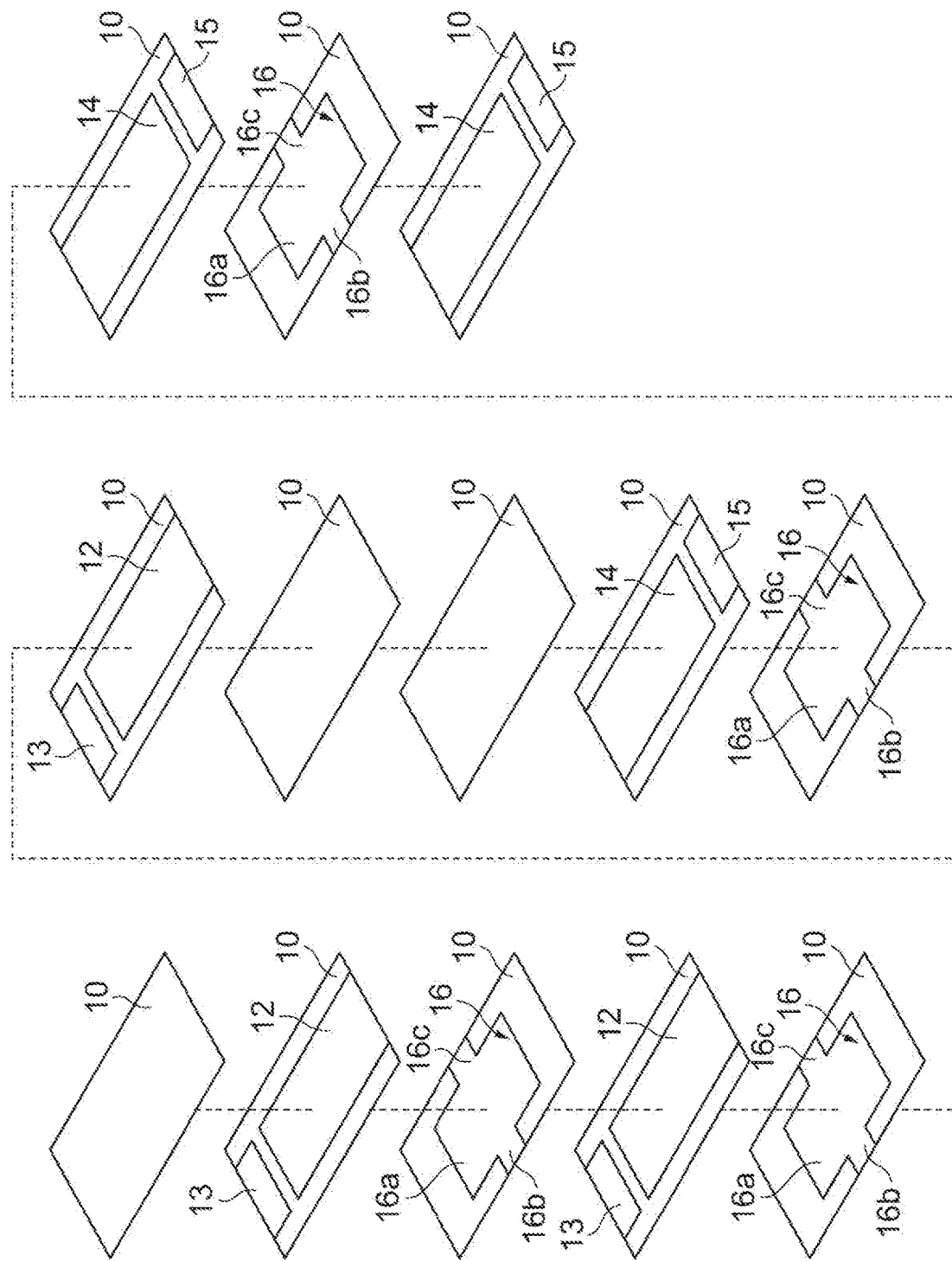
FIG. 5 is an exploded perspective view of an element assembly of the multilayer capacitor illustrated in FIG. 2.

As illustrated in FIG. 5, the element assembly 2 has a configuration in which a plurality of dielectric layers (insulating layers) 10 are laminated in the direction in which the main surfaces 2c and 2d as a pair are opposite to each other. In the element assembly 2, the lamination direction of the plurality of dielectric layers 10 (hereinafter, simply referred to as "lamination direction") matches the first direction D1. For example, the dielectric layers 10 are constituted by a sintered body of a ceramic green sheet including a dielectric material (dielectric ceramic such as a $BaTiO_3$-based dielectric ceramic, a $Ba(Ti,Zr)O_3$-based dielectric ceramic, or a $(Ba, Ca)TiO_3$-based dielectric ceramic). In an actual element assembly 2, the dielectric layers 10 are integrally formed to a certain extent at which a boundary between the dielectric layers 10 is not visually recognized.

Figure 3:
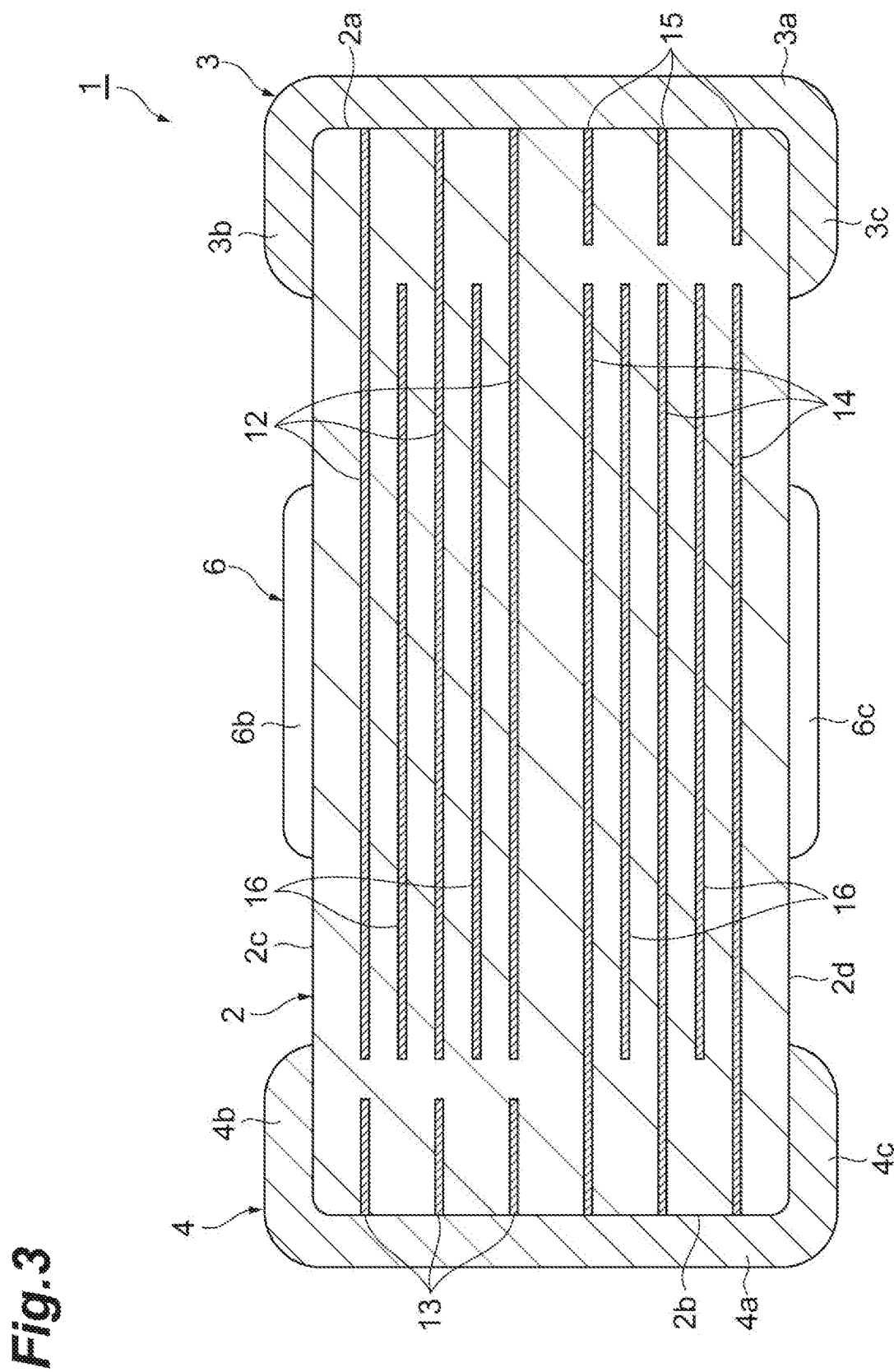
FIG. 3 is a view illustrating a cross-sectional configuration of the multilayer capacitor illustrated in FIG. 2.
Figure 4A:
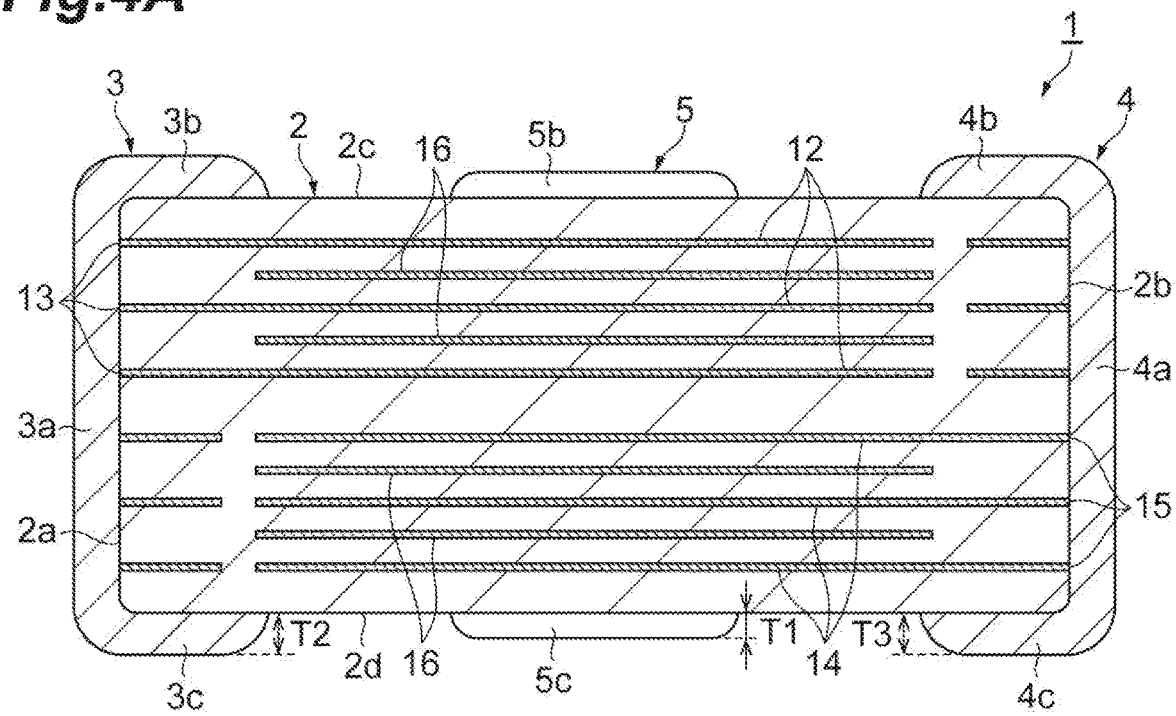
FIG. 4A is a view illustrating a cross-sectional configuration of the multilayer capacitor illustrated in FIG. 2.
Figure 4B:
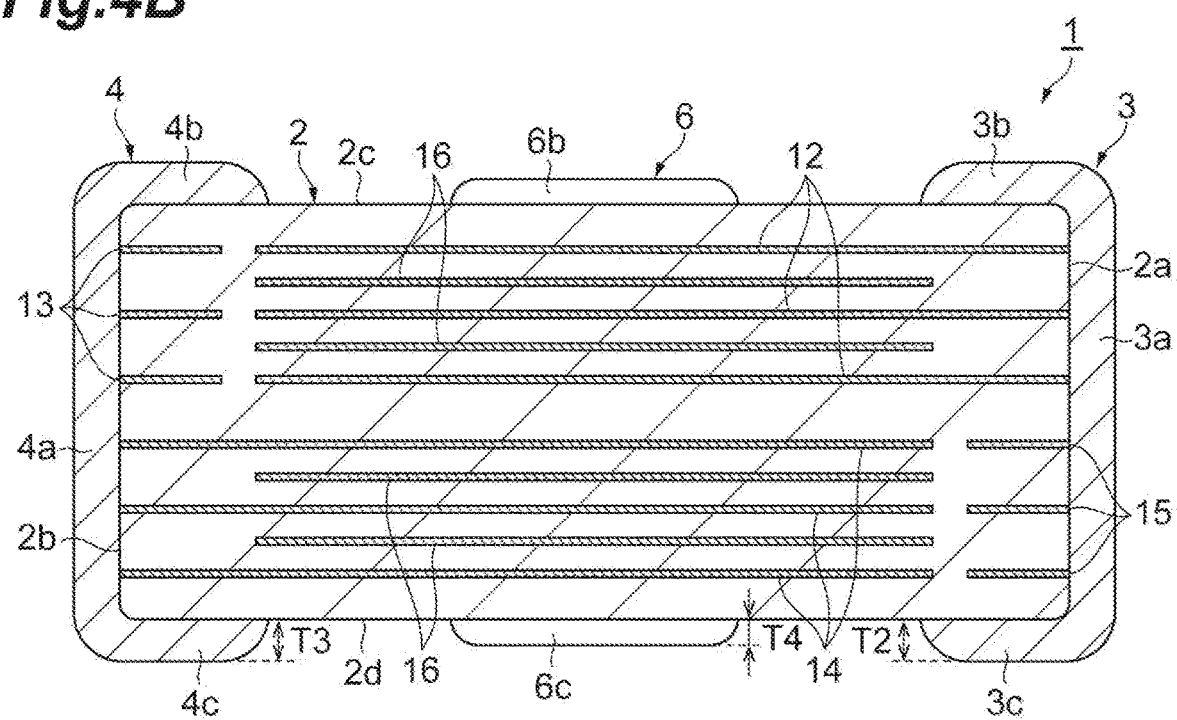
FIG. 4B is a view illustrating a cross-sectional configuration of the multilayer capacitor illustrated in FIG. 2.

As illustrated in FIG. 3, FIG. 4A, and FIG. 4B, the multilayer capacitor 1 includes a plurality of first internal electrodes 12, a plurality of first dummy electrodes 13, a plurality of second internal electrodes 14, a plurality of second dummy electrodes 15, and a plurality of third internal electrodes 16 as internal conductors which are disposed in the element assembly 2. In this embodiment, the number (here, three) of the plurality of first internal electrodes 12 is the same as the number of the plurality of second internal electrodes 14.

The plurality of first internal electrodes 12, the plurality of first dummy electrodes 13, the plurality of second internal electrodes 14, the plurality of second dummy electrodes 15, and the plurality of third internal electrodes 16 are constituted by a conductive material (for example, Ni, Cu, and the like) that is typically used as an internal electrode of a lamination-type electrical element. The plurality of first internal electrodes 12, the plurality of first dummy electrodes 13, the plurality of second internal electrodes 14, the plurality of second dummy electrodes 15, and the plurality of third internal electrodes 16 are constituted by a sintered body of conductive paste including the conductive material.

The first internal electrodes 12, the second internal electrodes 14, and the third internal electrodes 16 are disposed at positions (layers) different from each other in the first direction D1 of the element assembly 2. The first internal electrodes 12 and the third internal electrodes 16 are alternately disposed to be opposite to each other at an interval in the first direction D1 at the inside of the element assembly 2. The second internal electrodes 14 and the third internal electrodes 16 are alternately disposed to be opposite to each other at an interval in the first direction D1 at the inside of the element assembly 2. The first internal electrodes 12 and the first dummy electrodes 13 are disposed at the same position (layer) at the inside of the element assembly 2. The second internal electrodes 14 and the second dummy electrodes 15 are disposed at the same position (layer) at the inside of the element assembly 2.

As illustrated in FIG. 3, FIG. 4A, and FIG. 4B, the plurality of first internal electrodes 12 are disposed in a region on the one main surface 2c side in the first direction D1 of the element assembly 2. In this embodiment, the plurality of first internal electrodes 12 are disposed in a region on the one main surface 2c side of the element assembly 2 in comparison to the central portion of the element assembly 2 in the first direction D1.

As illustrated in FIG. 5, the first internal electrodes 12 have a rectangular shape in which the second direction D2 is set as a long-side direction, and the third direction D3 is set as a short-side direction. One end of the first internal electrodes 12 in the longitudinal direction is exposed to one end surface 2a. The other end of the first internal electrodes 12 in the longitudinal direction is located on the one end surface 2a side in comparison to the other end surface 2b, and is spaced away from the other end surface 2b. The first internal electrodes 12 are not exposed to the other end surface 2b, the pair of main surfaces 2c and 2d, and the pair of lateral surfaces 2e and 2f. In the first internal electrodes 12, the end exposed to the one end surface 2a is electrically connected to the first external electrode 3.

The first dummy electrodes 13 have rectangular shapes in which the second direction D2 is set as a lateral direction and the third direction D3 is set as a longitudinal direction. One end of the first dummy electrodes 13 in the lateral direction is exposed at the other end surface 2b. The other end of the first dummy electrodes 13 in the lateral direction is located on the other end surface 2b side in comparison to the one end surface 2a, and is spaced away from the one end surface 2a. The first internal electrodes 12 and the first dummy electrodes 13 are disposed at a predetermined interval in the second direction D2 (are electrically insulated). In the first dummy electrodes 13, the end exposed to the other end surface 2b is electrically connected to the second external electrode 4.

As illustrated in FIG. 3, FIG. 4A, and FIG. 4B, the plurality of second internal electrodes 14 are disposed in a region on the other main surface 2d side in the first direction D1 of the element assembly 2. In this embodiment, the plurality of second internal electrodes 14 are disposed in a region on the other main surface 2d side of the element assembly 2 in comparison to the central portion of the element assembly 2 in the first direction D1.

As illustrated in FIG. 5, the second internal electrodes 14 have rectangular shapes in which the second direction D2 is set as a long-side direction and the third direction D3 is set as a short-side direction. One end of the second internal electrodes 14 is exposed to the other end surface 2b. The other end of the second internal electrodes 14 in the longitudinal direction is located on the other end surface 2b side in comparison to the one end surface 2b, and is spaced away from the one end surface 2a. The second internal electrodes 14 are not exposed to the one end surface 2a, the pair of main surfaces 2c and 2d, and the pair of lateral surfaces 2e and 2f. In the second internal electrodes 14, the end exposed to the other end surface 2b is electrically connected to the second external electrode 4.

The second dummy electrodes 15 have rectangular shapes in which the second direction D2 is set as a lateral direction and the third direction D3 is set as a longitudinal direction. One end of the second dummy electrodes 15 in the lateral direction is exposed to the one end surface 2a. The other end of the second dummy electrodes 15 in the lateral direction is located on the one end surface 2a side in comparison to the other end surface 2b, and is spaced away from the other end surface 2b. The second internal electrodes 14 and the second dummy electrodes 15 are disposed at a predetermined interval in the second direction D2. In the second dummy electrodes 15, the end exposed to the one end surface 2a is electrically connected to the first external electrode 3.

Each of the third internal electrodes 16 includes a main electrode portion 16a and connection portions 16b and 16c. The main electrode portions 16a are opposite to each of the first internal electrodes 12 or each of the second internal electrodes 14 in the first direction D1 through a part (dielectric layer 10) of the element assembly 2. The main electrode portion 16a has a rectangular shape in which the second direction D2 is set as a long-side direction and the third direction D3 is set as a short-side direction. The connection portion 16b extends from one side (one long side) of the main electrode portion 16a and is exposed to the one lateral surface 2e. The connection portion 16c extends from one side (the other long side) of the main electrode portion 16a and is exposed to the other lateral surface 2f. The third internal electrodes 16 are exposed to the pair of lateral surfaces 2e and 2f, and are not exposed to the pair of end surfaces 2a and 2b and the pair of main surfaces 2c and 2d. The main electrode portion 16a and the connection portions 16b and 16c are integrally formed.

Figure 2:
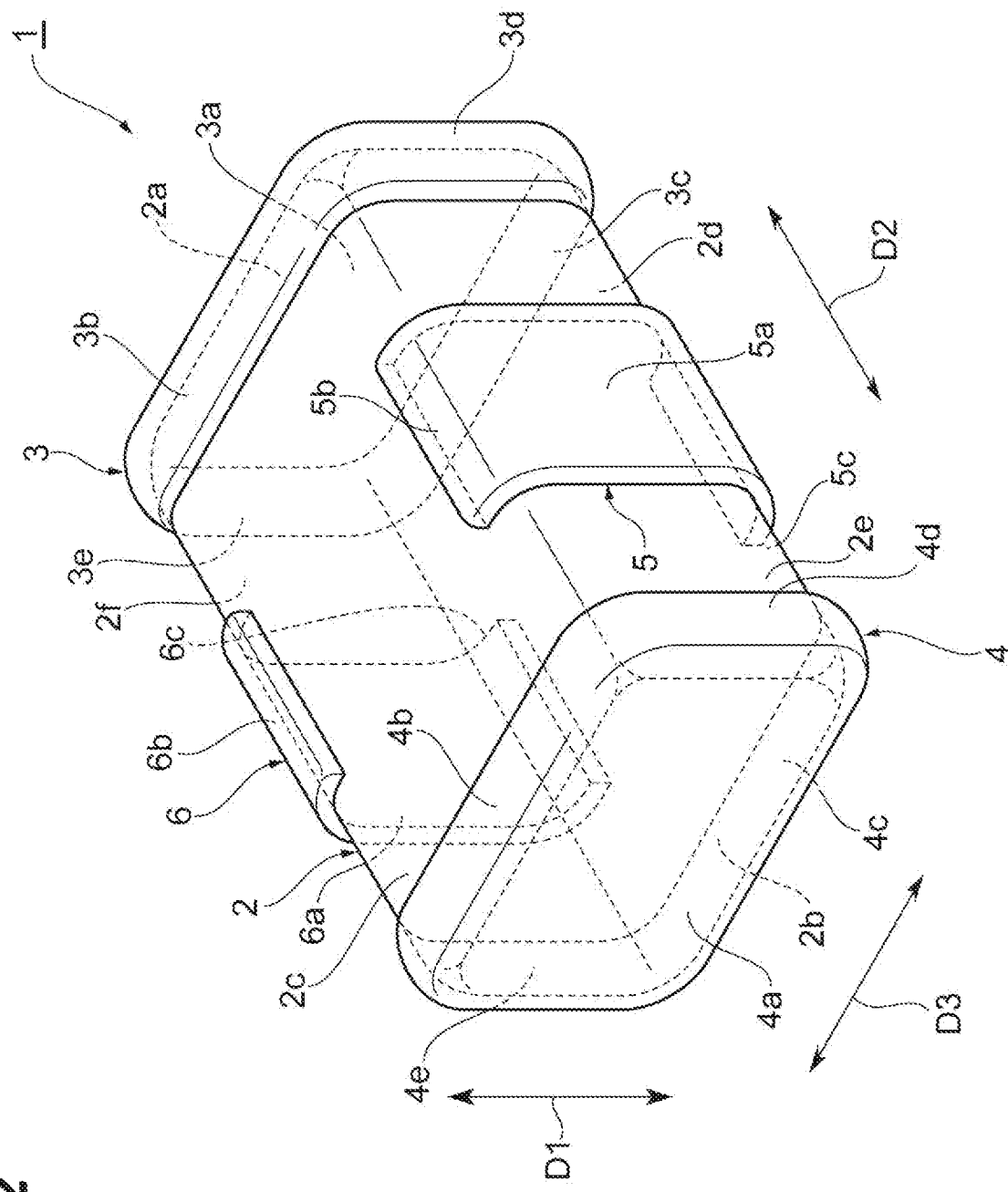
FIG. 2 is a perspective view illustrating a multilayer capacitor according to a first embodiment.

As illustrated in FIG. 2, the first external electrode 3 is disposed on the one end surface 2a side. The first external electrode 3 includes an electrode portion 3a that is disposed on the end surface 2a, electrode portions 3b and 3c which are respectively disposed on the pair of main surfaces 2c and 2d, and electrode portions 3d and 3e which are respectively disposed on the pair of lateral surfaces 2e and 2f. The electrode portion 3a, and the electrode portions 3b, 3c, 3d, and 3e are connected at a ridgeline portion of the element assembly 2, and are electrically connected to each other. The first external electrode 3 is formed on five surfaces including the one end surface 2a, the pair of main surfaces 2c and 2d, and the pair of lateral surfaces 2e and 2f. The electrode portion 3a is disposed to cover the portion, which is exposed to the end surface 2a, of the first internal electrodes 12, and the portion, which is exposed to the end surface 2a, of the second dummy electrodes 15. The first internal electrodes 12 and the second dummy electrodes 15 are directly connected to the first external electrode 3.

The second external electrode 4 is disposed on the other end surface 2b side. The second external electrode 4 includes an electrode portion 4a that is disposed on the end surface 2b, electrode portions 4b and 4c which are respectively disposed on the pair of main surfaces 2c and 2d, and electrode portions 4d and 4e which are respectively disposed on the pair of lateral surfaces 2e and 2f. The electrode portion 4a, and the electrode portions 4b, 4c, 4d, and 4e are connected at a ridgeline portion of the element assembly 2, and are electrically connected to each other. The second external electrode 4 is formed on five surfaces including the one end surface 2b, the pair of main surfaces 2c and 2d, and the pair of lateral surfaces 2e and 2f. The electrode portion 4a is disposed to cover the portion, which is exposed to the end surface 2b, of the second internal electrodes 14, and the portion, which is exposed to the end surface 2b, of the first dummy electrodes 13, and the second internal electrodes 14 and the first dummy electrodes 13 are directly connected to the second external electrode 4.

On the one lateral surface 2e side, the first connection conductor 5 is disposed at the central portion in the second direction D2. The first connection conductor 5 includes an electrode portion 5a that is disposed on the lateral surface 2e side, and electrode portions 5b and 5c which are respectively disposed on the pair of main surfaces 2c and 2d. The electrode portion 5a, the electrode portion 5b, and the electrode portion 5c are connected at a ridgeline portion of the element assembly 2, and are electrically connected to each other. The first connection conductor 5 is formed on three surfaces including the pair of main surfaces 2c and 2d, and the one lateral surface 2e.

The electrode portion 5a is disposed to cover a portion, which is exposed to the lateral surface 2e, of the connection portion 16b of the third internal electrodes 16, and the connection portion 16b is directly connected to the first connection conductor 5. That is, the connection portion 16b connects the main electrode portion 16a and the electrode portion 5a. According to this, the third internal electrodes 16 are electrically connected to the first connection conductor 5.

On the other lateral surface 2f side, the second connection conductor 6 is disposed at the central portion in the second direction D2. The second connection conductor 6 includes an electrode portion 6a that is disposed on the lateral surface 2f side, and electrode portions 6b and 6c which are respectively disposed on the pair of main surfaces 2c and 2d. The electrode portion 6a, the electrode portion 6b, and the electrode portion 6c are connected at a ridgeline portion of the element assembly 2, and are electrically connected to each other. The second connection conductor 6 is formed on three surfaces including the pair of main surfaces 2c and 2d and the one lateral surface 2f.

The electrode portion 6a is disposed to cover a portion, which is exposed to the lateral surface 2e, of the connection portion 16c of the third internal electrodes 16, and the connection portion 16c is directly connected to the second connection conductor 6. That is, the connection portion 16c connects the main electrode portion 16a and the electrode portion 6a. According to this, the third internal electrodes 16 are electrically connected to the second connection conductor 6.

As illustrated in FIG. 4A, the thickness T2 of the electrode portion 3c, which is disposed on the main surface 2d of the element assembly 2, of the first external electrode 3, in the first direction D1, and the thickness T3 of the electrode portion 4c of the second external electrode 4 in the first direction D1 are approximately the same as each other. The thickness T1 of the electrode portion 5c of the first connection conductor 5 in the first direction D1 is smaller than the thickness T2 of the electrode portion 3c of the first external electrode 3 and the thickness T3 of the electrode portion 4c of the second external electrode 4 (T1<T2, T3). As illustrated in FIG. 4B, the thickness T4 of the electrode portion 6c, which is disposed on the main surface 2d of the element assembly 2, of the second connection conductor 6 in the first direction D1 is smaller than the thickness T2 of the electrode portion 3c of the first external electrode 3 and the thickness T3 of the electrode portion 4c of the second external electrode 4 (T4<T2, T3). The thickness T1 of the electrode portion 5c of the first connection conductor 5 and the thickness T4 of the electrode portion 6c of the second connection conductor 6 are approximately the same as each other (T1=T4).

Figure 6:
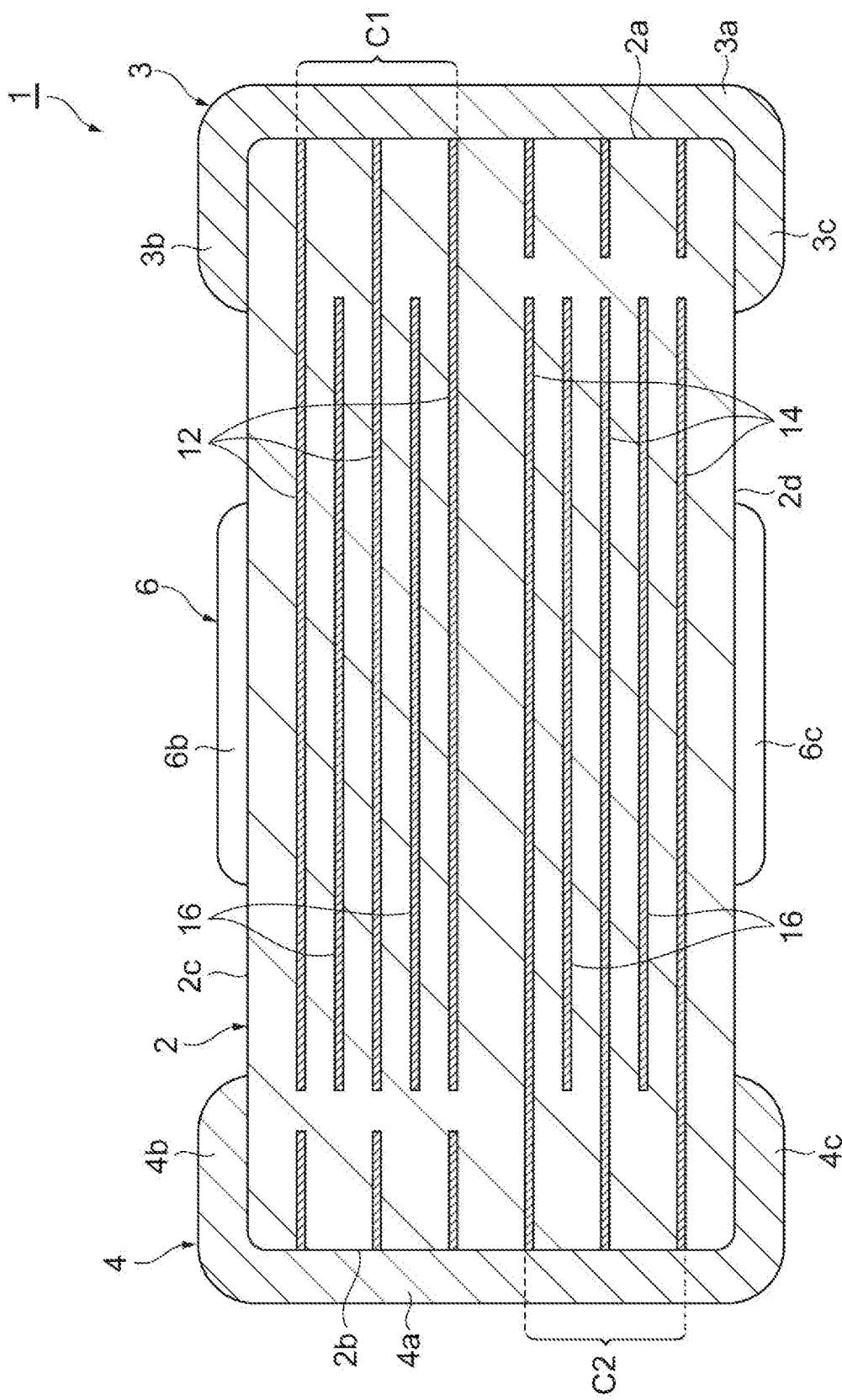
FIG. 6 is a view illustrating a cross-sectional configuration of the multilayer capacitor illustrated in FIG. 2.
Figure 7:
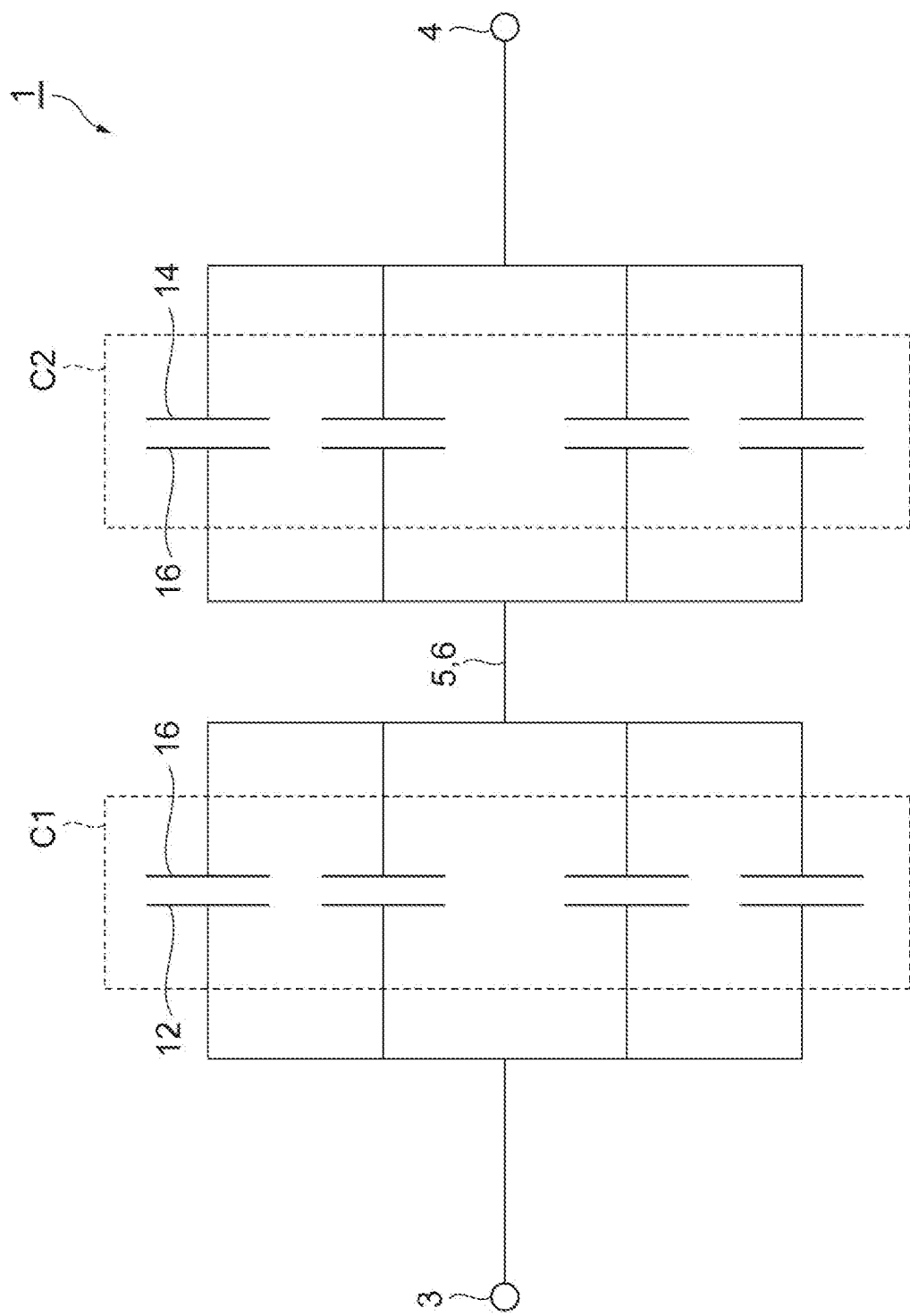
FIG. 7 is an equivalent circuit diagram of the multilayer capacitor illustrated in FIG. 2.

As illustrated in FIG. 6 and FIG. 7, the multilayer capacitor 1 includes a first capacitance portion C1 and a second capacitance portion C2. As illustrated in FIG. 6, the first capacitance portion C1 is constituted by the first internal electrodes 12 and the third internal electrodes 16 which are alternately disposed to be opposite to each other at an interval in the first direction D1 at the inside of the element assembly 2. In this embodiment, the first capacitance portion C1 is constituted by a region on the one main surface 2c side of the element assembly 2 in comparison to the central portion of the element assembly 2 in the first direction D1. The first capacitance portion C1 constitutes a first capacitor component.

The second capacitance portion C2 is constituted by the second internal electrodes 14 and the third internal electrodes 16 which are alternately disposed to be opposite to each other at an interval in the first direction D1 at the inside of the element assembly 2. In this embodiment, the second capacitance portion C2 is constituted by a region on the other main surface 2d side of the element assembly 2 in comparison to the central portion of the element assembly 2 in the first direction D1. The second capacitance portion C2 constitutes a second capacitor component.

As illustrated in FIG. 7, in the multilayer capacitor 1 having the above-described configuration, a plurality of the first capacitance portions C1 are electrically connected in parallel, and a plurality of the second capacitance portions C2 are electrically connected in parallel. In the multilayer capacitor 1, the first capacitance portion C1 and the second capacitance portion C2 are electrically connected in series. Specifically, the first capacitance portions C1 and the second capacitance portions C2 are electrically connected in series by the plurality of third internal electrodes 16 which are electrically connected to each other by the first connection conductor 5 and the second connection conductor 6. Furthermore, it is not necessary for the number of the first capacitance portions C1 and the second capacitance portions C2 as illustrated in FIG. 7 to be the same as the number of the first internal electrodes 12, the second internal electrodes 14, and the third internal electrodes 16 as illustrated in FIG. 3.

As illustrated in FIG. 1, the circuit substrate 100 includes a power supply 120 and an electronic control unit (ECU) 130. The power supply 120 and the ECU 130 constitute an electronic circuit. In addition, as illustrated in FIG. 8A and FIG. 8B, the circuit substrate 100 includes a substrate ST and land electrodes L1 and L2 which are mounted on the substrate ST. The substrate ST is provided with interconnections E1 and E2 which are electrically connected to the land electrodes L1 and L2. The interconnections E1 and E2 are electrically connected to the power supply 120 and the ECU 130.

As illustrated in FIG. 8B, in the electronic component device 110, the main surface 2d (mounting surface) of the element assembly 2 of the multilayer capacitor 1 is downwardly located, the electrode portion 3c of the first external electrode 3 and the land electrode L1 are disposed to be opposite to each other, and the electrode portion 4c of the second external electrode 4 and the land electrode L2 are disposed to be opposite to each other. The first external electrode 3 and the land electrode L1 are joined to each other with solder S1, and the second external electrode 4 and the land electrode L2 are joined to each other with solder S2. According to this, in the electronic component device 110, the first external electrode 3 of the multilayer capacitor 1 and the land electrode L1 are electrically connected to each other, and the second external electrode 4 and the land electrode L2 are electrically connected to each other. That is, in the electronic component device 110, only the first external electrode 3 and the second external electrode 4 of the multilayer capacitor 1 are electrically connected to the electronic circuit (the power supply 120 and the ECU 130) through the interconnections E1 and E2. In the electronic component device 110, the first connection conductor 5 and the second connection conductor 6 are not electrically connected to the electronic circuit of the circuit substrate 100.

As described above, in the multilayer capacitor 1 of the electronic component device 110 according to this embodiment, only the first external electrode 3 and the second external electrode 4 of the multilayer capacitor 1 are electrically connected to the electrical circuit of the circuit substrate 100. In the multilayer capacitor 1, the first capacitance portion C1 is constituted by the first internal electrodes 12 which are electrically connected to the first external electrode 3, and the third internal electrodes 16, and the second capacitance portion C2 is constituted by the second internal electrodes 14 which are connected to the second external electrode 4, and the third internal electrodes 16. The plurality of third internal electrodes 16 are electrically connected to each other by the first connection conductor 5 and the second connection conductor 6. According to this, the multilayer capacitor 1 has a configuration in which the first capacitance portion C1 and the second capacitance portion C2 (two capacitor components) are connected in series. Accordingly, in the multilayer capacitor 1, an improvement in a withstand voltage property is realized.

In addition, in the multilayer capacitor 1, since the first capacitance portion C1 and the second capacitance portion C2 are connected in series by the plurality of third internal electrodes 16 which are electrically connected to each other by the first connection conductor 5 and the second connection conductor 6, for example, in a case where a problem occurs in the first capacitance portion C1, a variation occurs in electrostatic capacitance and a resistance value. According to this, in the multilayer capacitor 1, even though a problem occurs after mounting, it is possible to detect the problem. As a result, in the electronic component device 110 including the multilayer capacitor 1, it is possible to detect occurrence of a problem while realizing an improvement in a withstand voltage property.

In addition, in the multilayer capacitor 1, as illustrated in FIG. 7, it is possible to realize a configuration in which the first capacitance portion C1 and the second capacitance portion C2 (two capacitor components) are connected in series with one multilayer capacitor (with one chip). Accordingly, in the multilayer capacitor 1, it is possible to realize safety design (design capable of detecting occurrence of a problem while realizing an improvement in a withstand voltage property) with one chip.

In the multilayer capacitor 1 of the electronic component device 110 according to this embodiment, the first internal electrodes 12 are disposed in a region on the one main surface 2c side at the inside of the element assembly 2, and the second internal electrodes 14 are disposed in a region on the other main surface 2d side at the inside of the element assembly 2. According to this, in the multilayer capacitor 1, the first capacitance portion C1 is constructed in the region on the one main surface 2c side, and the second capacitance portion C2 is constructed in the region on the other main surface 2d side. According to this, in a case where the multilayer capacitor 1 is mounted in a state in which the other main surface 2d is set as a mounting surface, even in a case where cracks occur in the element assembly 2 from both of the first external electrode 3 side and the second external electrode 4 side, the second internal electrodes 14 may be broken, but it is possible to avoid breakage of the first internal electrodes 12 disposed on the one main surface 2c side. Accordingly, in the multilayer capacitor 1, it is possible to protect the first capacitance portion C1. As described above, in the multilayer capacitor 1, even in a case where cracks occur in the element assembly 2, it is possible to protect a part of the capacitance portions.

In the multilayer capacitor 1 of the electronic component device 110 according to this embodiment, the main surface 2d of the element assembly 2 is a mounting surface. The multilayer capacitor 1 includes the first connection conductor 5 and the second connection conductor 6 which are electrically connected to the plurality of third internal electrodes 16. The first external electrode 3, the second external electrode 4, the first connection conductor 5, and the second connection conductor 6 respectively include the electrode portions 3c, 4c, 5c, and 6c which are disposed on the mounting surface. The thicknesses T2 and T3 (refer to FIG.

4A and FIG. 4B) of the electrode portions 3c and 4c of the first external electrode 3 and the second external electrode 4 in the first direction D1 are greater than the thicknesses T1 and T4 of the electrode portions 5c and 6c of the first connection conductor 5 and the second connection conductor 6 in the first direction D1. In this configuration, it is possible to stably mount the first external electrode 3 and the second external electrode 4 of the multilayer capacitor 1 on the circuit substrate 100.

In addition, in the configuration, since the thicknesses T1 and T4 of the electrode portions 5c and 6c of the first connection conductor 5 and second connection conductor 6 are smaller than the thicknesses T2 and T3 of the electrode portions 3c and 4c of the first external electrode 3 and the second external electrode 4, when the multilayer capacitor 1 is mounted on the circuit substrate 100, it is possible to suppress the first connection conductor 5 and the second connection conductor 6 from coining into contact with the circuit substrate 100. Accordingly, it is possible to suppress the first external electrode 3 and/or the second external electrode 4 from being electrically connected to the first connection conductor 5 and the second connection conductor 6. As a result, in the multilayer capacitor 1, the first capacitance portion C1 and the second capacitance portion C2 can be connected in series.

The multilayer capacitor 1 of the electronic component device 110 according to this embodiment includes the first dummy electrodes 13 which are disposed to be spaced away from the first internal electrodes 12 at the same layer as in the first internal electrodes 12, and are connected to the second external electrode 4 different from the first external electrode 3 to which the first internal electrodes 12 are connected. In addition, the multilayer capacitor 1 includes the second dummy electrodes 15 which are disposed to be spaced from the second internal electrodes 14 at the same layer as in the second internal electrodes 14, and are connected to the first external electrode 3 different from the second external electrode 4 to which the second internal electrodes 14 are connected. In this configuration, the first external electrode 3 and the second dummy electrodes 15 are joined to each other, and the second external electrode 4 and the first dummy electrodes 13 are joined to each other. As a result, in the multilayer capacitor 1, it is possible to secure joining strength between the element assembly 2, and the first external electrode 3 and the second external electrode 4.

Figure 9A:
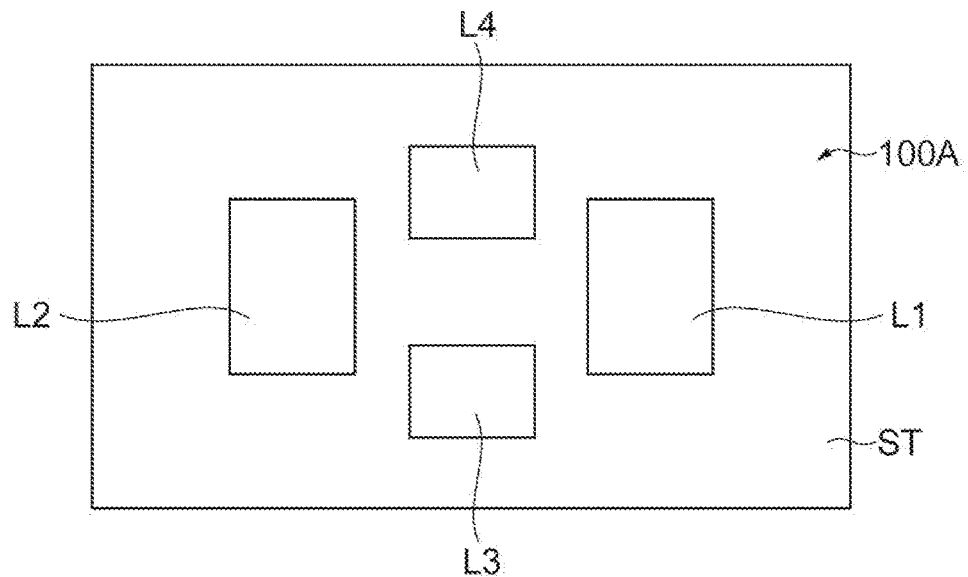
FIG. 9A is a view illustrating a circuit substrate of an electronic component device according to a modification example.
Figure 9B:
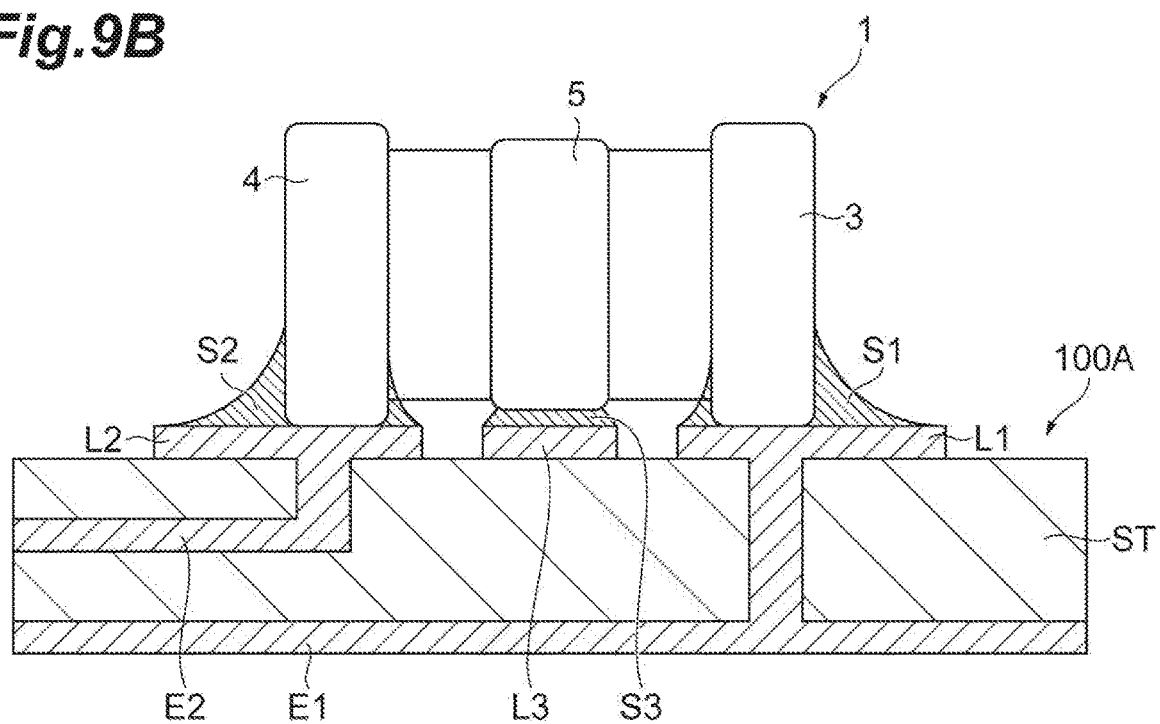
FIG. 9B is a view illustrating a state in which the multilayer capacitor is mounted on the circuit substrate.

In the embodiment, description has been given of an aspect in which the circuit substrate 100 of the electronic component device 110 includes the land electrodes L1 and L2 as an example. As illustrated in FIG. 9A, a circuit substrate 100A may further include land electrodes L3 and L4. The land electrodes L3 and L4 are mounted on the substrate ST. The land electrodes L3 and L4 are not electrically connected to the electrical circuit. In this configuration, as illustrated in FIG. 9B, the main surface 2d (mounting surface) of the element assembly 2 of the multilayer capacitor 1 is downwardly located, the electrode portion 3c of the first external electrode 3 and the land electrode L1 are disposed to be opposite to each other, and the electrode portion 4c of the second external electrode 4 and the land electrode L2 are disposed to be opposite to each other. In addition, the electrode portion 5c of the first connection conductor 5 and the land electrode L3 are disposed to be opposite to each other, and the electrode portion 6c of the second connection conductor 6 and the land electrode L4 are disposed to be opposite to each other. The first external electrode 3 and the land electrode L1 are jointed to each other with solder S1, and the second external electrode 4 and the land electrode L2 are joined to each other with solder S2. In addition, the first connection conductor 5 and the land electrode L3 are joined with solder S3, and the second connection conductor 6 and the land electrode L4 are joined with solder (not illustrated).

According to this, in the electronic component device, the first external electrode 3 of the multilayer capacitor 1 and the land electrode L1 are electrically connected to each other, and the second external electrode 4 and the land electrode L2 are electrically connected to each other. That is, the first external electrode 3 and the second external electrode 4 of the multilayer capacitor 1 are electrically connected to the electronic circuit (the power supply 120 and the ECU 130) through the interconnections E1 and E2. In the electronic component device, the first connection conductor 5 and the second connection conductor 6 are not electrically connected to the electronic circuit of the circuit substrate 100A.

Hereinbefore, description has been given of the multilayer capacitor 1 according to the first embodiment. However, the multilayer capacitor 1 is not limited to the above-described aspect, and various modifications can be made in a range not departing from the gist of the invention.

Figure 10:
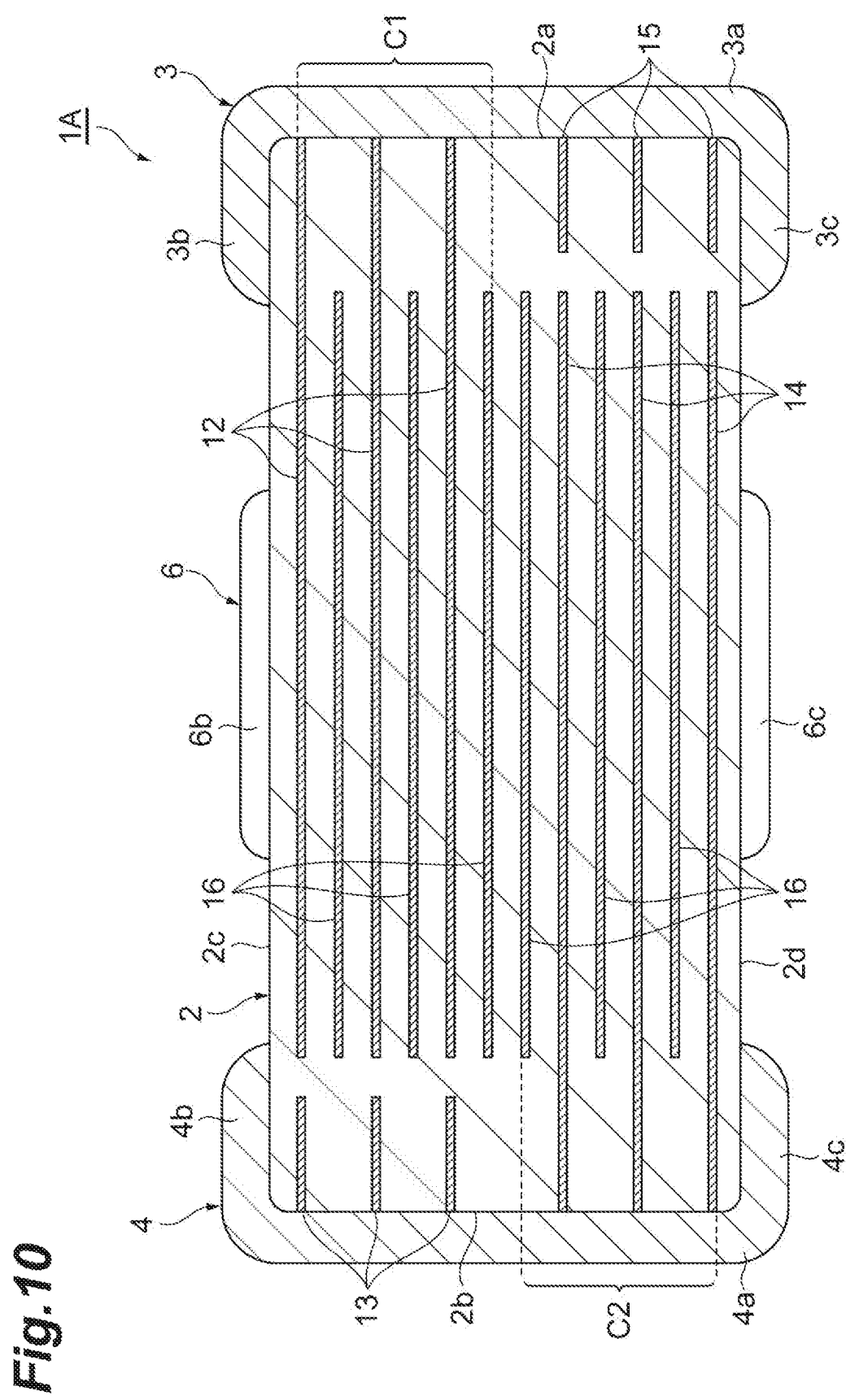
FIG. 10 is a view illustrating a cross-sectional configuration of a multilayer capacitor according to a modification example of the first embodiment.

In the embodiment, description has been given of an aspect in which the first internal electrodes 12 and the second internal electrodes 14 are disposed to be opposite to each other at the central portion of the element assembly 2 in the first direction D1 as an example. However, as illustrated in FIG. 10, a pair of third internal electrodes 16 may be disposed to be opposite to each other between the first internal electrodes 12 and the second internal electrodes 14. In the multiplayer capacitor 1A having the above-described configuration, a capacitance portion is not formed between the first capacitance portion C1 and the second capacitance portion C2. As a result, it is possible to easily realize a configuration in which the first capacitance portion C1 and the second capacitance portion C2 are electrically connected in series.

Figure 11:
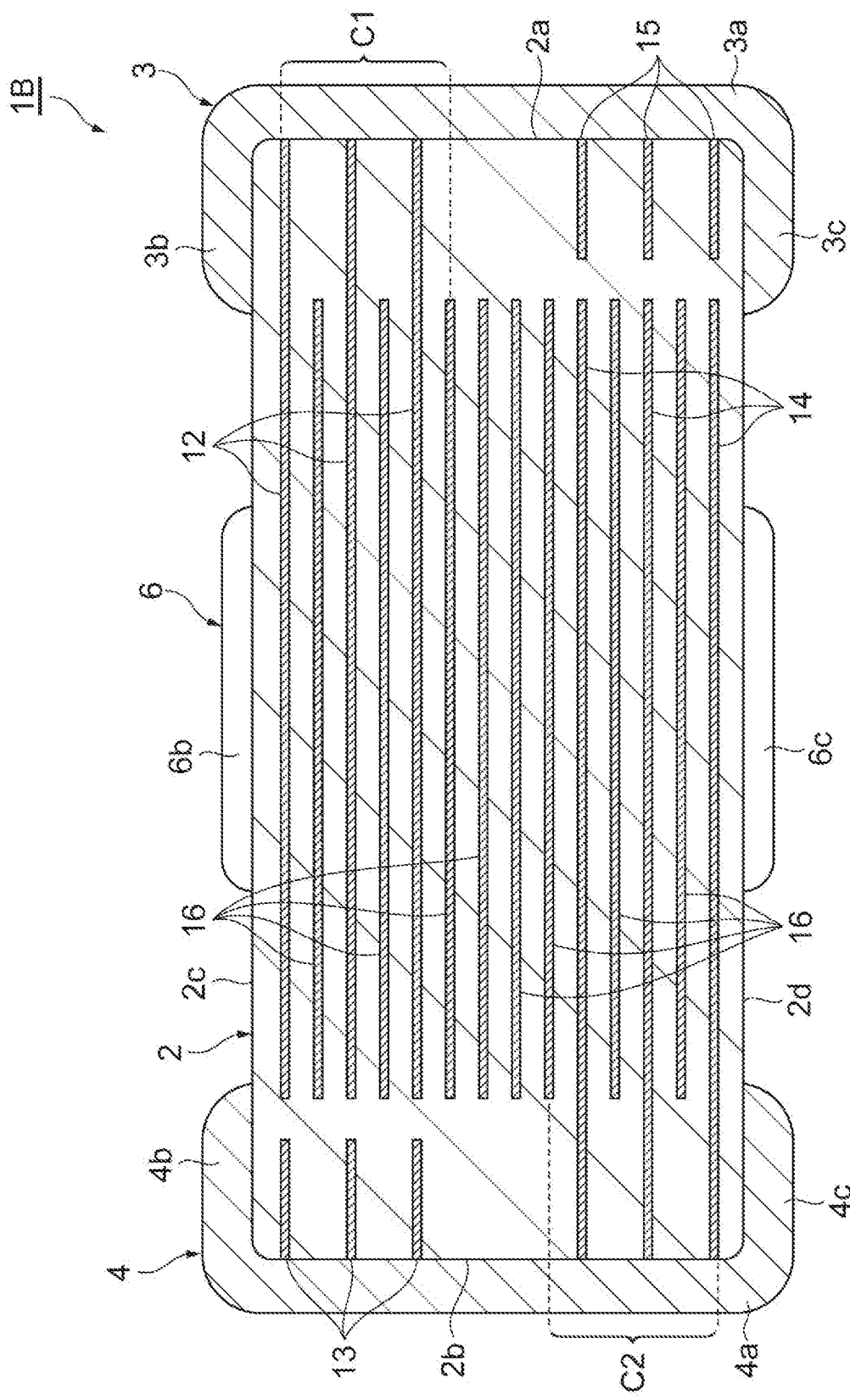
FIG. 11 is a view illustrating a cross-sectional configuration of the multilayer capacitor according to a modification example of the first embodiment.

As illustrated in FIG. 11, a plurality of (four in this embodiment) the third internal electrodes 16 may be disposed between the one first internal electrode 12 and the one second internal electrode 14. In a multilayer capacitor 1B having this configuration, for example, even in a case where breakage of the first internal electrodes 12, which constitute the first capacitance portion C1, occurs, it is possible to suppress the breakage from propagating to the second internal electrodes 14, which constitutes the second capacitance portion C2, due to the third internal electrodes 16. As a result, in the multilayer capacitor 1B, even in a case where cracks occur in the element assembly 2, it is possible to protect a part of the capacitance portions.

Figure 12:
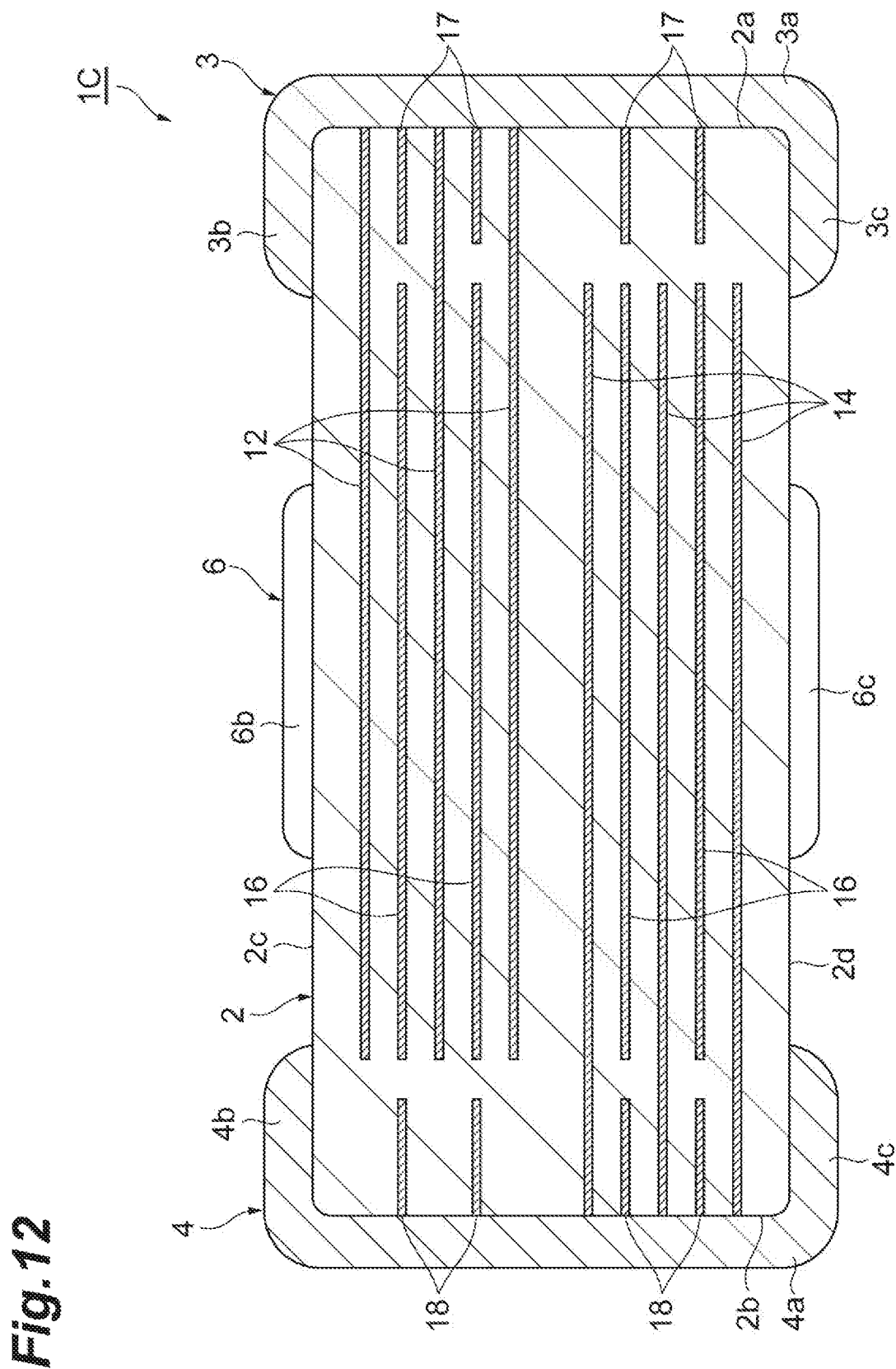
FIG. 12 is a view illustrating a cross-sectional configuration of the multilayer capacitor according to a modification example of the first embodiment.

In the embodiment, description has been given of an aspect in which the first dummy electrodes 13 are disposed at the same position as that of the first internal electrodes 12, and the second dummy electrodes 15 are disposed at the same position as that of the second internal electrodes 14 as an example. However, the dummy electrodes may be disposed at the same position as that of at least one side between the first internal electrodes 12 and the second internal electrodes 14. In addition, as in a multilayer capacitor 1C illustrated in FIG. 12, third dummy electrodes 17 and fourth dummy electrodes 18 may be disposed at the same positions as in the third internal electrodes 16. In addition, at least one side between the third dummy electrodes 17 and the fourth dummy electrodes 18 may be disposed at the same position that of the third internal electrodes 16. In addition, dummy electrodes may be disposed at the same position as that of the first internal electrodes 12, the second internal electrodes 14, and the third internal electrodes 16. In addition, the dummy electrodes may not be disposed.

Figure 13A:
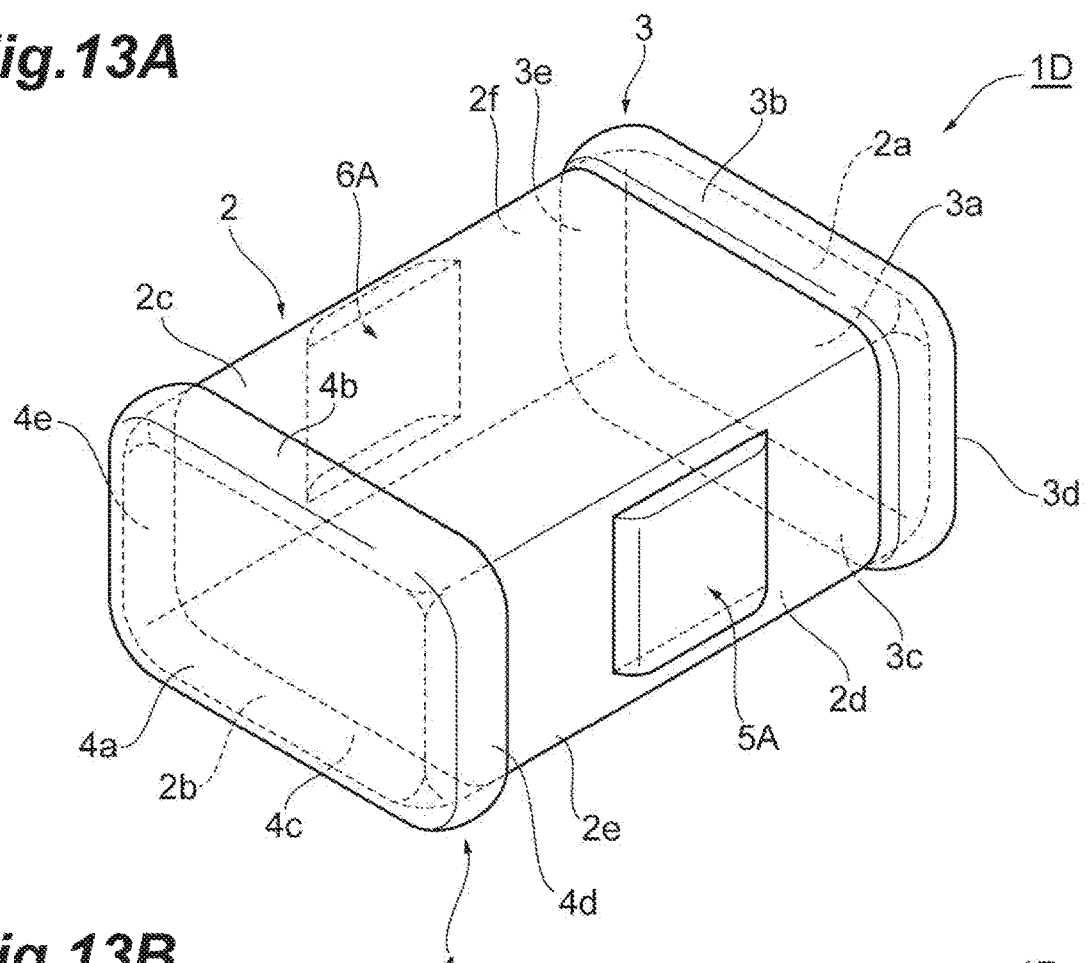
FIG. 13A is a perspective view illustrating a multilayer capacitor according to a modification example of the first embodiment.
Figure 13B:
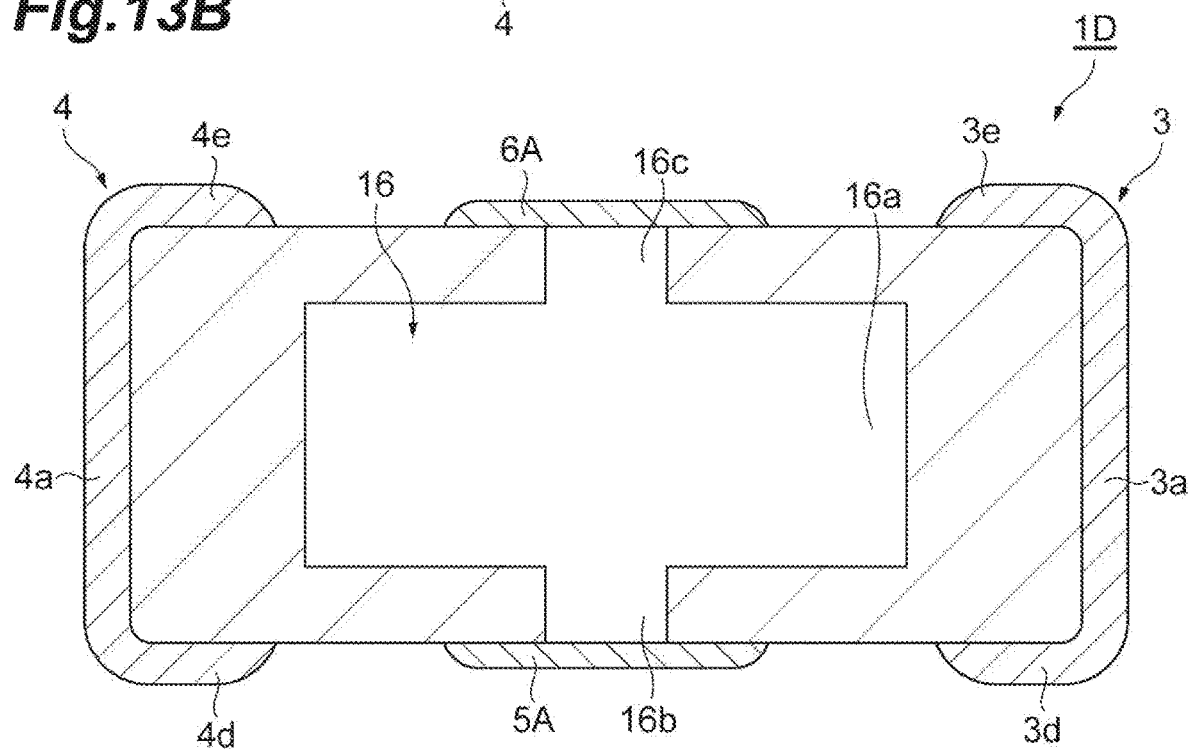
FIG. 13B is a view illustrating a cross-sectional configuration of the multilayer capacitor in FIG. 13A.

In the embodiment, description has been given of an aspect in which the first connection conductor 5 includes the electrode portions 5a to 5c, and the electrode portions 5b and 5c are respectively disposed on the pair of main surfaces 2c and 2d as an example. However, as in a multilayer capacitor 1D illustrated in FIG. 13A, a first connection conductor 5A may be disposed only on the lateral surface 2e of the element assembly 2. The first connection conductor 5A may be disposed to cover the entirety of a portion, which is exposed to the lateral surface 2e, of the connection portion 16b of the third internal electrodes 16. Similarly, the second connection conductor 6A may be disposed only on the lateral surface 2f of the element assembly 2. The second connection conductor 6A may be disposed to cover the entirety of a portion, which is exposed to the lateral surface 2f, of the connection portion 16c of the third internal electrodes 16. In this configuration, as illustrated in FIG. 13B, the connection portion 16b of the third internal electrode 16 is directly connected to the first connection conductor 5A, and the connection portion 16c of the third internal electrode 16 is directly connected to the second connection conductor 6A. In this configuration, it is possible to stably mount the first external electrode 3 and the second external electrode 4 of the multilayer capacitor 1D on the circuit substrate 100. In addition, it is possible to suppress short-circuiting from occurring between the first external electrode 3 and/or the second external electrode 4, and the first connection conductor 5 and/or the second connection conductor 6.

Figure 14A:
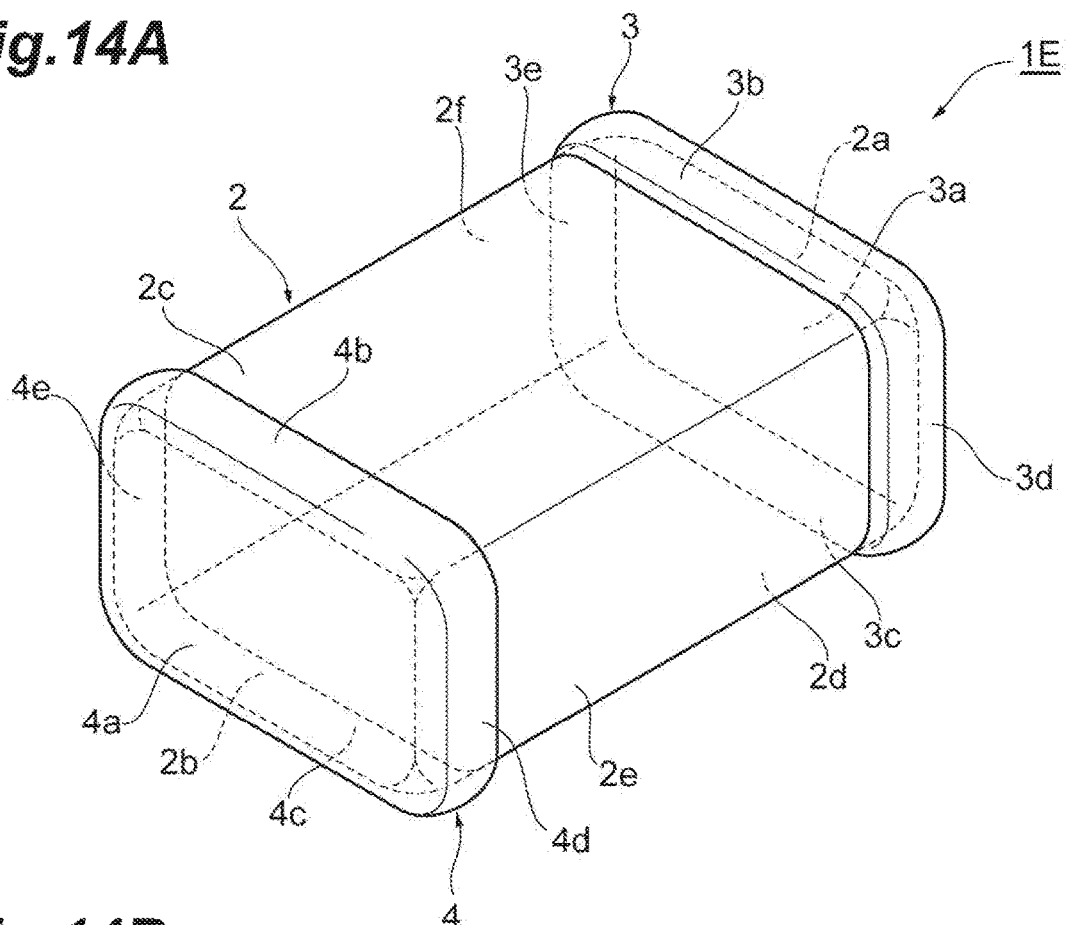
FIG. 14A is a perspective view illustrating a multilayer capacitor according to a modification example of the first embodiment.
Figure 14B:
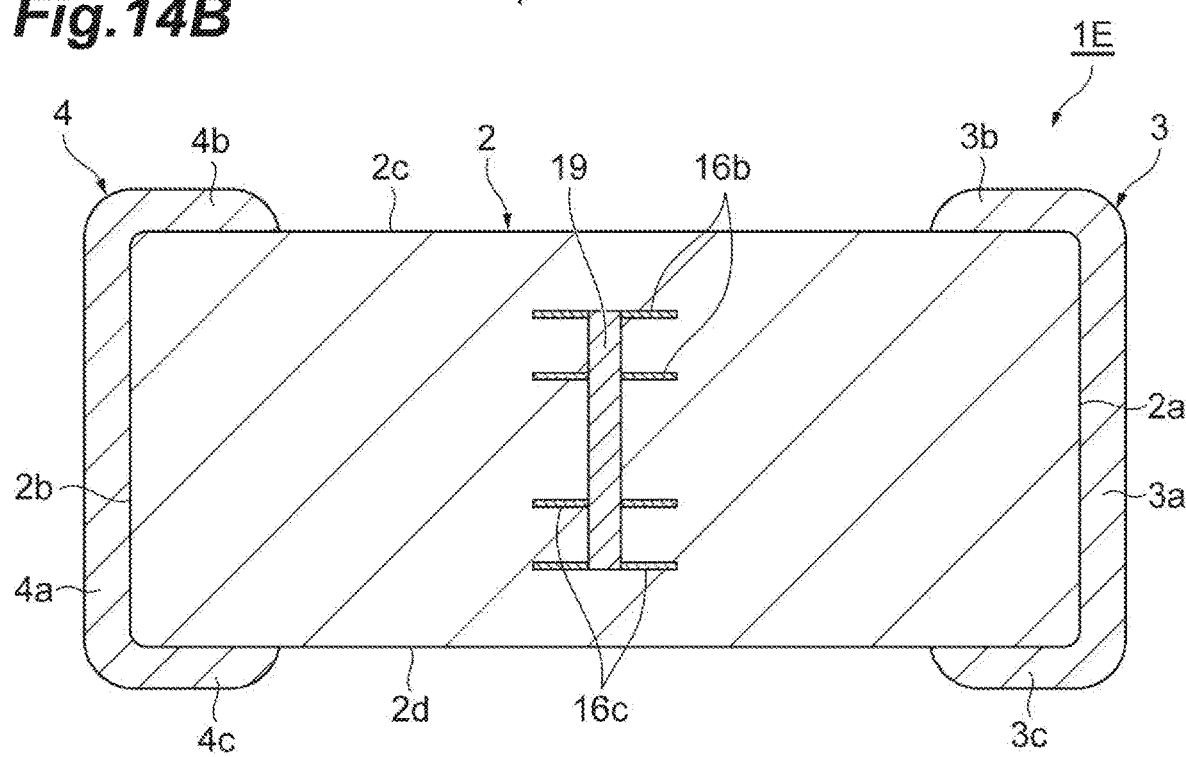
FIG. 14B is a view illustrating a cross-sectional configuration of the multilayer capacitor in FIG. 14A.
Figure 14C:
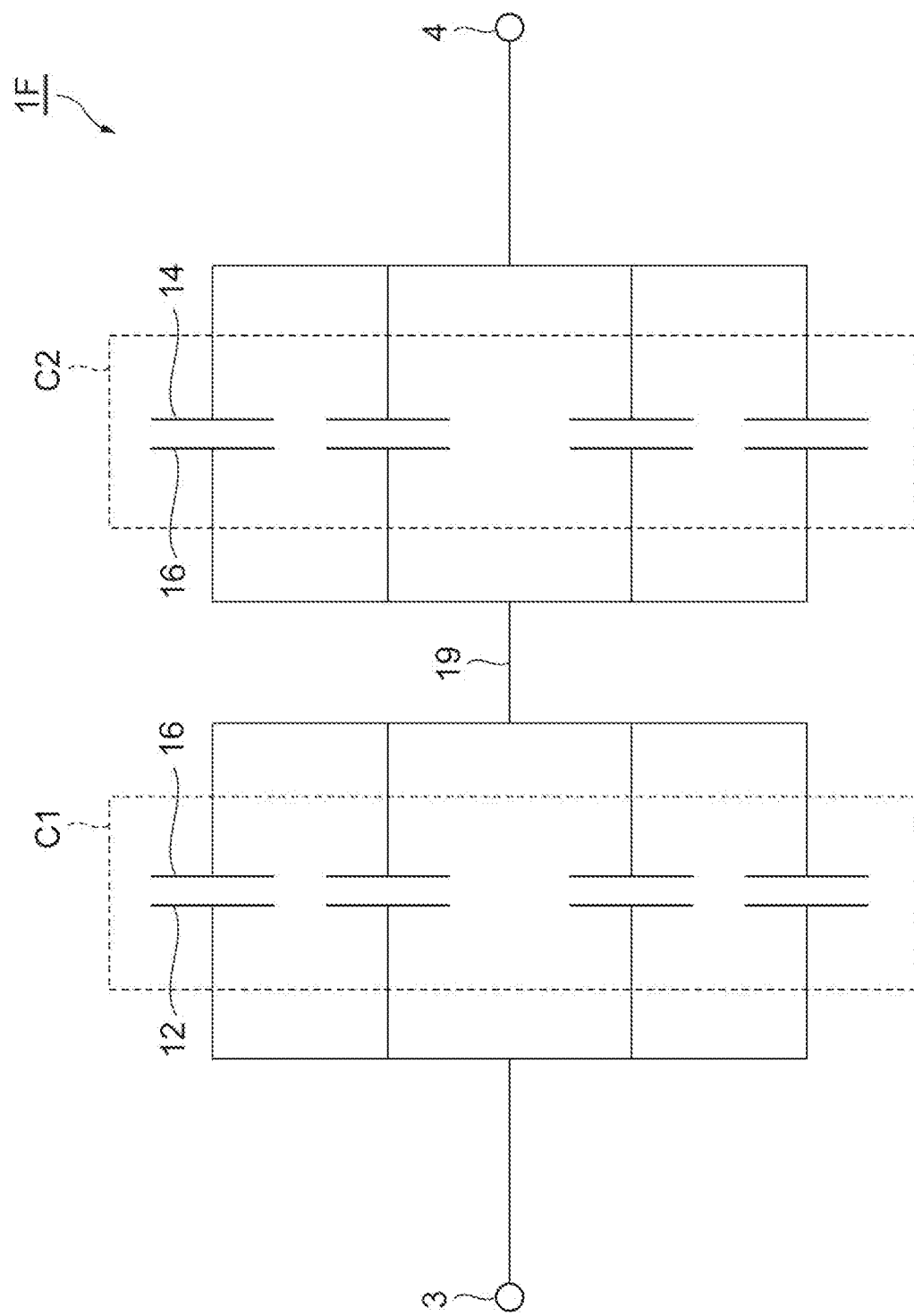
FIG. 14C is an equivalent circuit diagram of the multilayer capacitor illustrated in FIGS. 14A and 141.

In addition, as illustrated in FIG. 14A, in a multilayer capacitor 1E, a connection conductor may not be disposed on an outer surface of the element assembly 2. In this case, as illustrated in FIG. 14B, in the multilayer capacitor 1E, the connection portions 16b (16c) of the third internal electrodes 16 may be electrically connected to each other by a via-conductor 19. In this configuration, it is possible to stably mount the first external electrode 3 and the second external electrode 4 of the multilayer capacitor 1E on the circuit substrate 100. In addition, it is possible to suppress short-circuiting from occurring between the first external electrode 3 and/or the second external electrode 4, and the first connection conductor 5 and/or the second connection conductor 6. Also, as illustrated in FIG. 14C, which is similar to FIG. 7, in the multilayer capacitor 1 having the above-described configuration, a plurality of the first capacitance portions C1 are electrically connected in parallel, and a plurality of the second capacitance portions C2 are electrically connected in parallel. In the multilayer capacitor 1, the first capacitance portion C1 and the second capacitance portion C2 are electrically connected in series. Specifically, the first capacitance portions C1 and the second capacitance portions C2 are electrically connected in series by the plurality of third internal electrodes 16 which are electrically connected to each other by via conductor 19.

In the embodiment, description has been given of an aspect in which the plurality of first internal electrodes 12 are disposed in a region on the main surface 2c side, and the plurality of second internal electrodes 14 are disposed in a region on the main surface 2d side as an example. That is, description has been given of an aspect in which the first capacitance portion C1 is constructed in the region on the main surface 2c side, and the second capacitance portion C2 is constructed in the region on the main surface 2d side as an example. However, the plurality of first internal electrodes 12 may be disposed in a region on the main surface 2d side, and the plurality of second internal electrodes 14 may be disposed in a region on the main surface 2c side.

Second Embodiment

Figure 15:
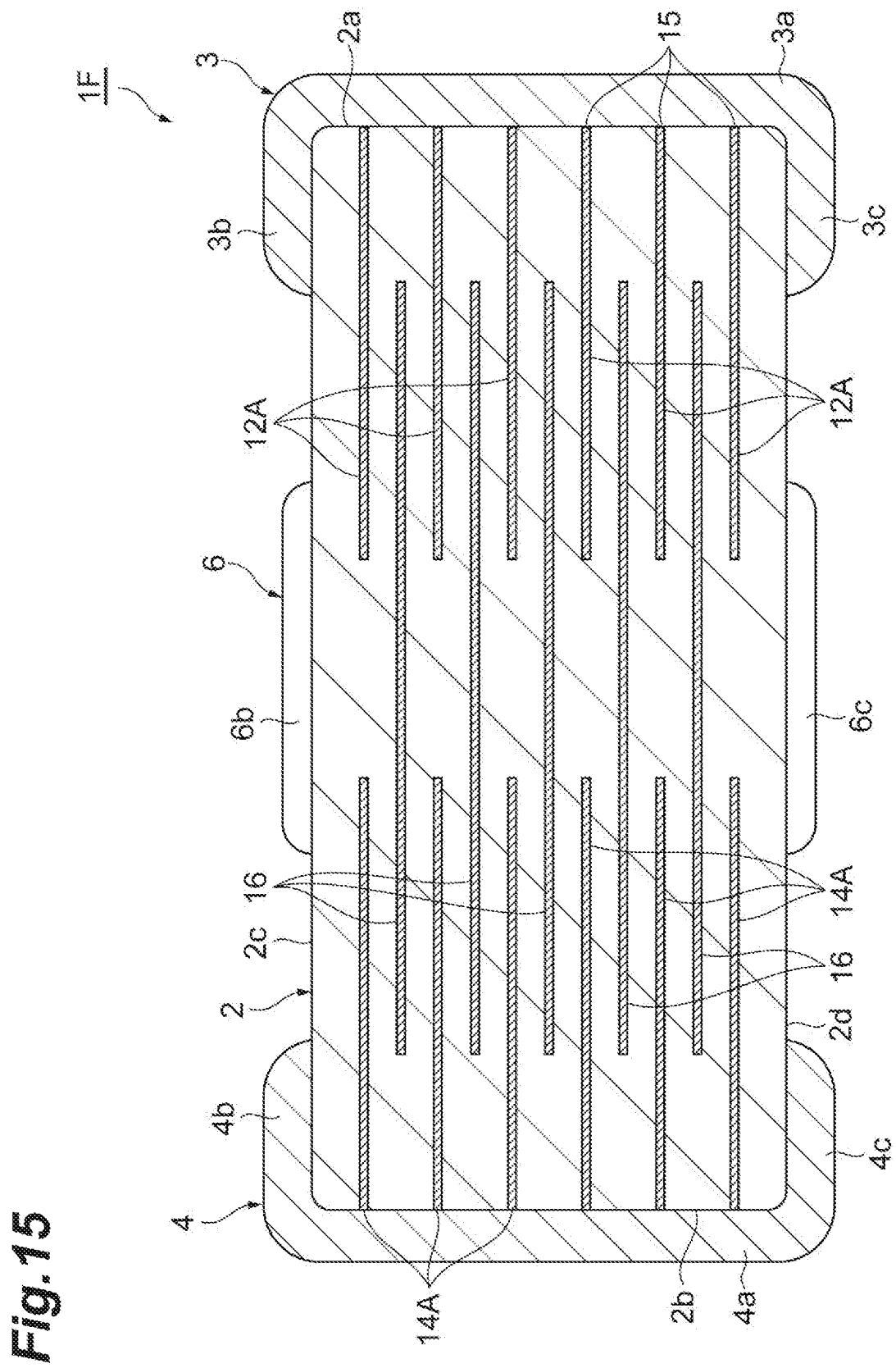
FIG. 15 is a view illustrating a cross-sectional configuration of a multilayer capacitor according to a second embodiment.

Subsequently, description will be given of a multilayer capacitor according to a second embodiment. As illustrated in FIG. 15, a multilayer capacitor 1F according to the second embodiment includes an element assembly 2, a first external electrode 3, a second external electrode 4, a first connection conductor 5 (refer to FIG. 2), and a second connection conductor 6 which are disposed on an outer surface of the element assembly 2.

The multilayer capacitor 1F includes a plurality of first internal electrodes 12A, a plurality of second internal electrodes 14A, and a plurality of third internal electrodes 16 as internal conductors which are disposed in the element assembly 2. In this embodiment, the number (here, six) of the plurality of first internal electrode 12A is the same as the number of the plurality of second internal electrodes 14A.

The first internal electrodes 12A and the second internal electrodes 14A are disposed at the same position (layer) of the element assembly 2 in the first direction D1. The first internal electrodes 12A, the second internal electrodes 14A, and the third internal electrodes 16 are alternately disposed to be opposite to each other at an interval in the first direction D1 at the inside of the element assembly 2.

The plurality of first internal electrodes 12A are disposed in a region on the one end surface 2a side in the second direction D2 of the element assembly 2. In this embodiment, the plurality of first internal electrodes 12A are disposed in a region on the one end surface 2a side of the element assembly 2 in comparison to the central portion of the element assembly 2 in the second direction D2.

Figure 16:
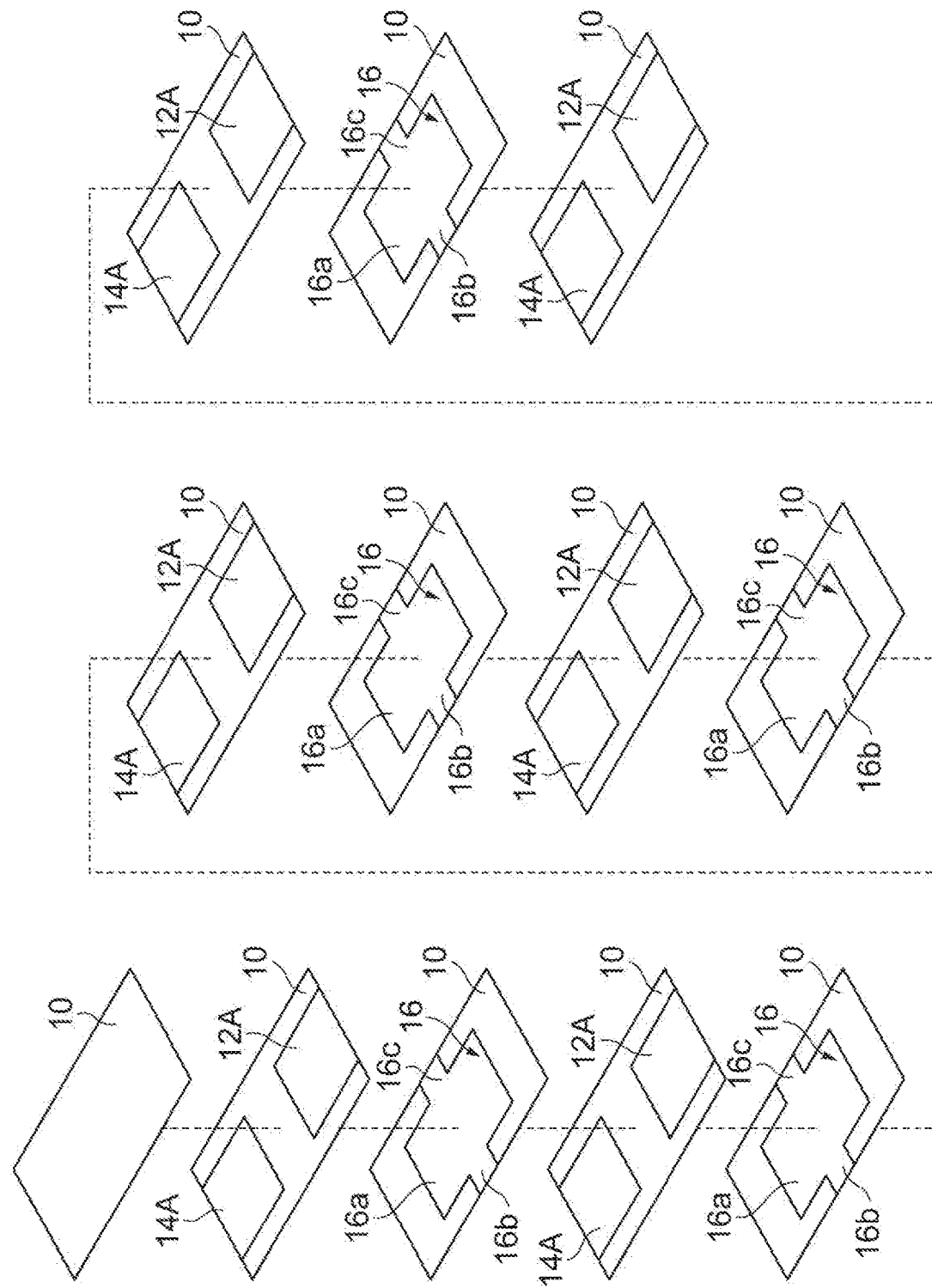
FIG. 16 is an exploded perspective view of an element assembly of the multilayer capacitor illustrated in FIG. 15.

As illustrated in FIG. 16, one end of the first internal electrodes 12A is exposed to the one end 2a. The other end of the first internal electrodes 12A is spaced away from the other end of the second internal electrodes 14A at a predetermined interval. The first internal electrodes 12A are not exposed to the other end surface 2b, the pair of main surfaces 2c and 2d, and the pair of lateral surfaces 2e and 2f. In the first internal electrodes 12A, an end exposed to the one end 2a is electrically connected to the first external electrode 3.

The plurality of second internal electrodes 14A are disposed in a region on the other end surface 2b side in the second direction D2 of the element assembly 2. In this embodiment, the plurality of second internal electrodes 14A are disposed in a region on the other end surface 2b side of the element assembly 2 in comparison to the central portion of the element assembly 2 in the second direction D2. In this embodiment, the second internal electrodes 14A have the same shape and the same dimensions as a shape and dimensions of the first internal electrodes 12A.

One end of the second internal electrodes 14A is exposed to the other end surface 2b. The other end of the second internal electrodes 14A is spaced away from the other end of the first internal electrodes 12A at a predetermined interval. The second internal electrodes 14A is not exposed to the one end surface 2a, the pair of main surfaces 2c and 2d, and the pair of lateral surfaces 2e and 2f. In the second internal electrodes 14, an end exposed to the other end surface 2b is electrically connected to the second external electrode 4.

The third internal electrodes 16 include a main electrode portion 16a, and connection portions 16b and 16c. The main electrode portion 16a are opposite to each of the first internal electrodes 12A and each of the second internal electrodes 14A in the first direction D1 through a part (dielectric layer 10) of the element assembly 2.

As illustrated in FIG. 17, the multilayer capacitor 1F includes a first capacitance portion C11 and a second capacitance portion C22. The first capacitance portion C11 is constituted by the first internal electrodes 12A and the third internal electrodes 16 which are alternately disposed to be opposite to each other at an interval in the first direction D1 at the inside of the element assembly 2. In this embodiment, the first capacitance portion C11 is constructed in a region on the one end surface 2a side of the element assembly 2 in comparison to the central portion of the element assembly 2 in the second direction D2. The first capacitance portion C11 constitutes a first capacitor component.

The second capacitance portion C22 is constituted by the second internal electrodes 14A and the third internal electrodes 16 which are alternately disposed to be opposite to each other at an interval in the first direction D1 at the inside of the element assembly 2. In this embodiment, the second capacitance portion C22 is constructed in a region on the other end 2b side of the element assembly 2 in comparison to the central portion of the element assembly 2 in the second direction D2. The second capacitance portion C22 constitutes a second capacitor component.

In the multilayer capacitor 1F, a plurality of the first capacitance portions C11 are electrically connected in parallel, and a plurality of the second capacitance portions C22 are electrically connected in parallel. In the multilayer capacitor 1F, the first capacitance portions C11 and the second capacitance portions C22 are electrically connected in series. Specifically, the first capacitance portion C11 and the second capacitance portion C22 are electrically connected in series by the plurality of third internal electrodes 16 which are electrically connected by the first connection conductor 5 and the second connection conductor 6. Furthermore, it is not necessary for the number of the first capacitance portion C11 and the second capacitance portion C22 as illustrated in FIG. 17 to be the same as the number of the first internal electrodes 12A, the second internal electrodes 14A, and the third internal electrodes 16 as illustrated in FIG. 15.

As in the first embodiment, the multilayer capacitor 1F having the above-described configuration is mounted on the circuit substrate 100 including the land electrodes L1 and L2, thereby constituting an electronic component device. As in the first embodiment, as illustrated in FIG. 8B, in the electronic component device, the main surface 2d (mounting surface) of the element assembly 2 of the multilayer capacitor 1F is downwardly located, the electrode portion 3c of the first external electrode 3 and the land electrode L1 are disposed to be opposite to each other, and the electrode portion 4c of the second external electrode 4 and the land electrode L2 are disposed to be opposite to each other. The first external electrode 3 and the land electrode L1 are joined to each other with solder S1, and the second external electrode 4 and the land electrode L2 are joined to each other with solder S2. According to this, in the electronic component device, the first external electrode 3 of the multilayer capacitor 1F and the land electrode L1 are electrically connected to each other, and the second external electrode 4 and the land electrode L2 are electrically connected to each other. That is, in the electronic component device, only the first external electrode 3 and the second external electrode 4 of the multilayer capacitor 1F are electrically connected to the electronic circuit (the power supply 120 and the ECU 130) through the interconnections E1 and E2. In the electronic component device, the first connection conductor 5 and the second connection conductor 6 are not electrically connected to the electronic circuit of the circuit substrate 100.

As described above, in the multilayer capacitor 1F of the electronic component device according to this embodiment, the first capacitance portion C11 is constituted by the first internal electrodes 12A which are electrically connected to the first external electrode 3, and the third internal electrodes 16, and the second capacitance portion C22 is constituted by the second internal electrodes 14A which are connected to the second external electrode 4, and the third internal electrodes 16. The plurality of third internal electrodes 16 are electrically connected to each other by the first connection conductor 5 and the second connection conductor 6. According to this, the multilayer capacitor 1F has a configuration in which two capacitor components are connected in series. As a result, in the multilayer capacitor 1F, an improvement of the withstand voltage property is realized.

In addition, in the multilayer capacitor 1F, since the first capacitance portion C11 and the second capacitance portion C22 are connected in series by the plurality of third internal electrodes 16 which are electrically connected to each other by the first connection conductor 5 and the second connection conductor 6, for example, in a case where a problem occurs in the first capacitance portion C11, a variation occurs in electrostatic capacitance and a resistance value. According to this, in the multilayer capacitor 1F, even when a problem occurs after mounting, it is possible to detect the problem. As a result, in the electronic component device including the multilayer capacitor 1F, it is possible to detect occurrence of a problem while realizing an improvement of the withstand voltage property.

In addition, in the multilayer capacitor 1F, as illustrated in FIG. 17, it is possible to realize a configuration in which the first capacitance portion C11 and the second capacitance portion C22 (two capacitor components) are connected in series with one multilayer capacitor (with one chip). Accordingly, in the multilayer capacitor 1F, it is possible to realize safety design (design capable of detecting occurrence of a problem while realizing an improvement in a withstand voltage property) with one chip.

In the multilayer capacitor 1F of the electronic component device according to this embodiment, the first internal electrodes 12A are disposed in a region on the one end surface 2a side at the inside of the element assembly 2, and the second internal electrodes 14A are disposed in a region on the other end surface 2b side at the inside of the element assembly 2. According to this, in the multilayer capacitor 1F, the first capacitance portion C11 is constructed in the region on the one end surface 2a side, and the second capacitance portion C22 is constructed in the region on the other end surface 2b side. According to this, even in a case where bending occurs in the element assembly 2, and thus cracks occur in the element assembly 2 from the main surface 2c side and the main surface 2d side, for example, the second internal electrodes 14A disposed on the other end surface 2b side may be broken, but it is possible to avoid breakage of the first internal electrodes 12A disposed on the one end surface 2a side. Accordingly, in the multilayer capacitor 1F, it is possible to protect the first capacitance portion C11. As described above, in the multilayer capacitor 1F, even in a case where cracks occur in the element assembly 2, it is possible to protect a part of the capacitance portions.

In addition, in the multilayer capacitor 1F, an area (region) in which the first internal electrodes 12A and the second internal electrodes 14A, and the third internal electrodes 16 are opposite to each other is small, and thus it is possible to realize a reduction in equivalent series inductance (ESL), Hereinbefore, description has been given of the multilayer capacitor 1F according to the second embodiment, but the multilayer capacitor 1F is not limited to the above-described aspect, and various modifications can be made in a range not departing from the gist thereof.

In the embodiment, description has been given of an aspect in which the first connection conductor 5 includes the electrode portions 5a to 5c, and the electrode portions 5b and 5c are respectively disposed on the pair of main surfaces 2c and 2d as an example. However, as in the first embodiment (refer to FIG. 13A and FIG. 13B), the first connection conductor may be disposed only on the lateral surface 2e of the element assembly 2. The first connection conductor may be disposed to cover the entirety of a portion, which is exposed to the lateral surface 2e, of the connection portion 16b of the third internal electrodes 16. Similarly, the second connection conductor may be disposed only on the lateral surface 2f of the element assembly 2. The second connection conductor may be disposed to cover the entirety of a portion, which is exposed to the lateral surface 2f, of the connection portion 16c of the third internal electrode 16.

Figure 18A:
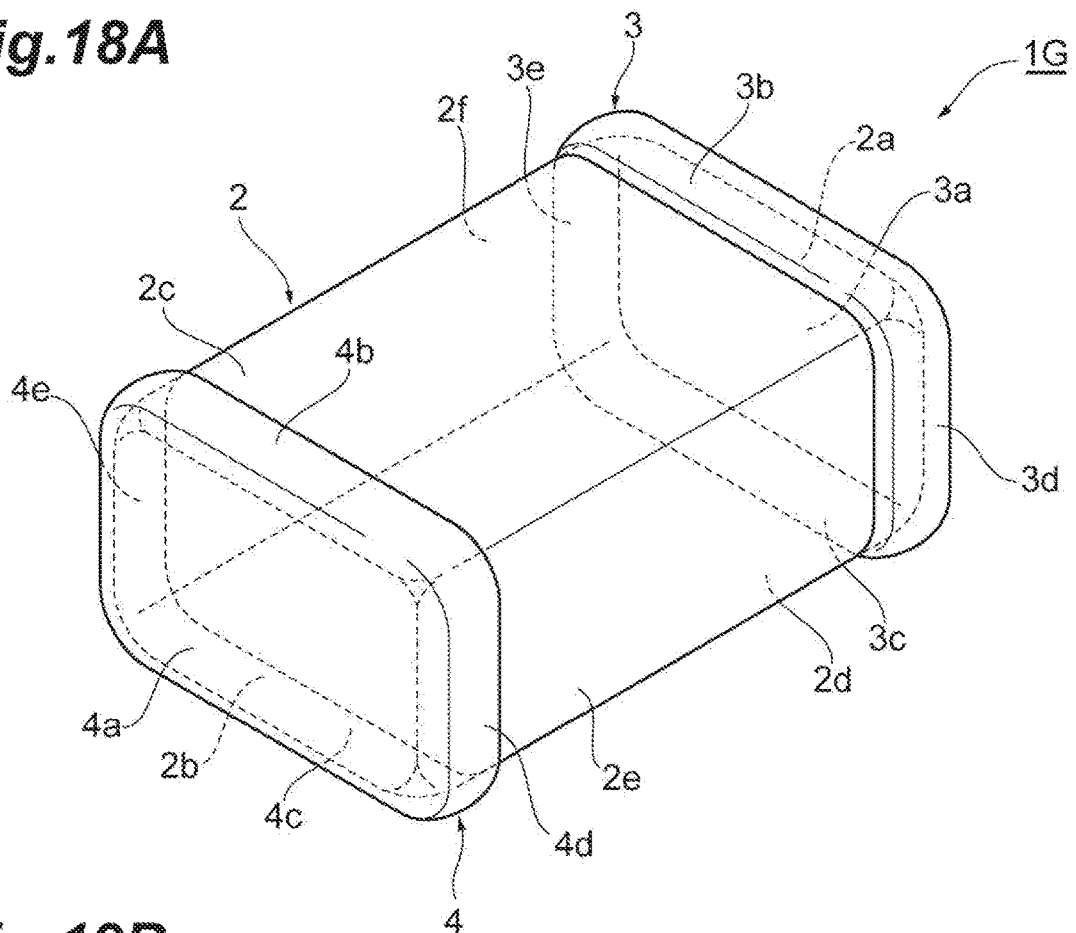
FIG. 18A is a perspective view illustrating a multilayer capacitor according to a modification example of the second embodiment.
Figure 18B:
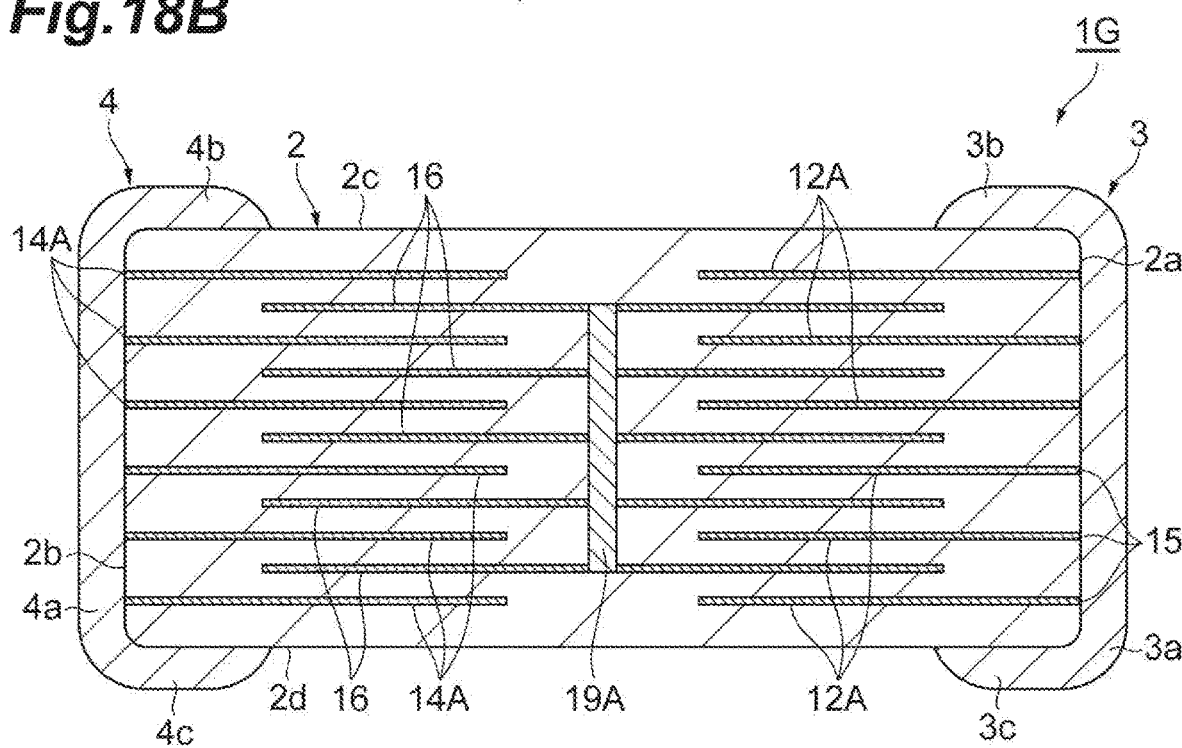
FIG. 18B is a view illustrating a cross-sectional configuration of the multilayer capacitor illustrated in FIG. 18A.

In addition, as illustrated in FIG. 18A, in a multilayer capacitor 1G, a connection conductor may not be disposed on an outer surface of the external assembly 2. In this case, as illustrated in FIG. 18B, in the multilayer capacitor 1G, the main electrode portion 16a of the third internal electrodes 16 may be electrically connected to each other by a via-conductor 19A. Also, as illustrated in FIG. 18C, in the multilayer capacitor 1G, a plurality of the first capacitance portions C1 are electrically connected in parallel, and a plurality of the second capacitance portions C2 are electrically connected in parallel. In the multilayer capacitor 1G, the first capacitance portions C1 and the second capacitance portions C2 are electrically connected in series. Specifically, the first capacitance portion C1 and the second capacitance portion C2 are electrically connected in series by via conductor 19A.

In the embodiment, description has been given of an aspect in which the plurality of first internal electrodes 12A are disposed in a region on the end surface 2a side, and the plurality of second internal electrodes 14A are disposed in a region on the end surface 2b side as an example. That is, description has been given of an aspect in which the first capacitance portion C11 is constructed in the region on the end surface 2a side, and the second capacitance portion C22 is constructed in the region on the end surface 2b side as an example. However, the plurality of first internal electrodes 12A may be disposed in a region on the end surface 2b side, and the plurality of second internal electrodes 14A may be disposed in a region on the end surface 2a side.

Third Embodiment

Figure 19:
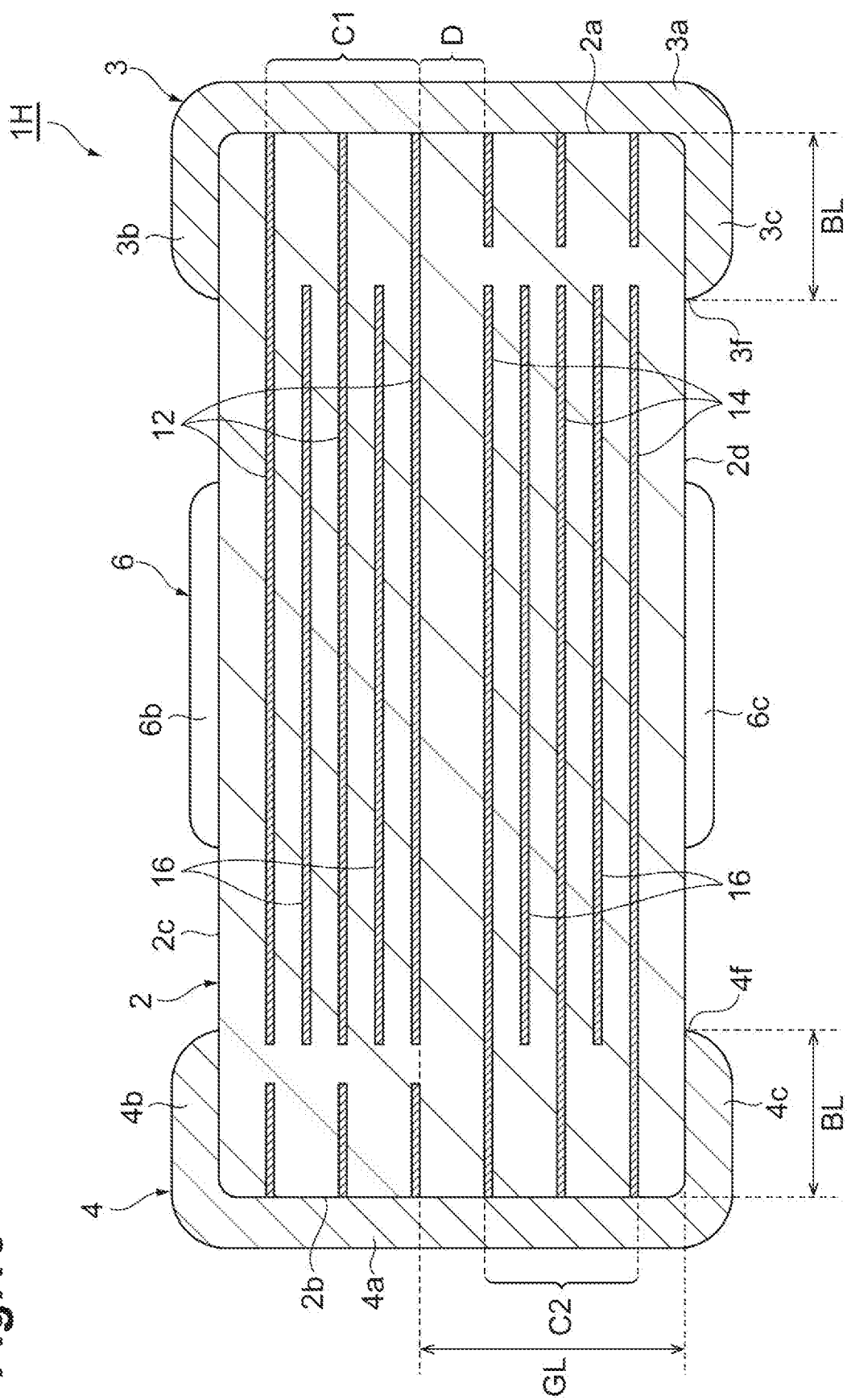
FIG. 19 is a view illustrating a cross-sectional configuration of a multilayer capacitor according to a third embodiment.

Subsequently, description will be given of a multilayer capacitor according to a third embodiment. As illustrated in FIG. 19, a multilayer capacitor 1H according to the third embodiment includes an element assembly 2, a first external electrode 3, a second external electrode 4, a first connection conductor 5 (refer to FIG. 2), and a second connection conductor 6 which are disposed on an outer surface of the element assembly 2.

As illustrated in FIG. 19, the multilayer capacitor 1H includes a first capacitance portion C1, a second capacitance portion C2, and an isolation portion D. The isolation portion D is provided between the first capacitance portion C1 and the second capacitance portion C2. In this embodiment, the isolation portion D is provided between the first internal electrodes 12 and the second internal electrodes 14. The isolation portion D is constructed by laminating a dielectric layer 10. Specifically, the isolation portion D may be constituted by laminating the dielectric layer 10 in at least two or more layers.

In this embodiment, electric field intensity of in the isolation portion D is smaller than electric field intensity of the first internal electrodes 12 and the third internal electrodes 16 in the first capacitance portion C1, and electrical field intensity of the second internal electrodes 14 and the third internal electrodes 16 in the second capacitance portion C2.

As illustrated in FIG. 19, in a case where a distance between an edge 4f, which is located on an inner side in the second direction D2, of the electrode portion 4c of the second external electrode 4 and the end surface 2b in the second direction D2 (a distance between an edge 3f, which is located on an inner side in the second direction D2, of the electrode portion 3c of the first external electrode 3 and the end surface 2a in the second direction D2) is set as BL, and a distance between the main surface 2d and the first capacitance portion C1 in the first direction D1 (in this embodiment, a distance between the main surface 2d and the first inner electrodes 12) is set as GL, the multilayer capacitor 1H satisfies the following relationship.

$$BL < GL \times 0.36$$

As described above, in the multilayer capacitor 1H of the electronic component device according to this embodiment, the first capacitance portion C1 is constructed by the first internal electrodes 12 which are electrically connected to the first external electrode 3, and the third internal electrodes 16, and the second capacitance portion C2 is constructed by the second internal electrodes 14 which are connected to the second external electrode 4, and the third internal electrodes 16. The plurality of third internal electrodes 16 are electrically connected to each other. According to this, the multilayer capacitor 1H has a configuration in which two capacitor components (a first capacitor component and a second capacitor component) are connected in series. As a result, in the multilayer capacitor 1H, an improvement in the withstand voltage property is realized. The multilayer capacitor 1H includes the isolation portion D that isolates the first capacitance portion C1 and the second capacitance portion C2 from each other, and electric field intensity in the isolation portion D is smaller than electric field intensity of the first internal electrodes 12 and the third internal electrodes 16 in the first capacitance portion C1, and electric field intensity of the second internal electrodes 14 and the third internal electrodes 16 in the second capacitance portion C2. According to this, in the multilayer capacitor 1H, it is possible to suppress insulation breakage and the like from occurring between the first capacitance portion C1 and the second capacitance portion C2. As a result, it is possible to realize an improvement in the withstand voltage property.

In the multilayer capacitor 1H of the electronic component device according to this embodiment, the plurality of third internal electrodes 16 are electrically connected to each other by the first connection conductor 5 and the second connection conductor 6. According to this, in the multilayer capacitor 1H, for example, in a case where a problem occurs in the first capacitance portion C1, a variation occurs in electrostatic capacitance and a resistance value. As a result, in the multilayer capacitor 1H, even though a problem occurs after mounting, it is possible to detect the problem.

In the multilayer capacitor 1H of the electronic component device according to this embodiment, the first internal electrodes 12 are disposed in a region on the one main surface 2c side at the inside of the element assembly 2, and the second internal electrodes 14 are disposed in a region on the other main surface 2d side at the inside of the element assembly 2. According to this, in the multilayer capacitor 1H, the first capacitance portion C1 is formed on the one main surface 2c side, and the second capacitance portion C2 is formed on the other main surface 2d side. According to this, in a case where the multilayer capacitor 1H is mounted in a state in which the other main surface 2d is set as a mounting surface, even in a case where cracks occur in the element assembly 2 from both of the first external electrode 3 side and the second external electrode 4 side, the second internal electrodes 14 may be broken, but it is possible to avoid breakage of the first internal electrodes 12 disposed on the one main surface 2c side. Accordingly, in the multilayer capacitor 1H, it is possible to protect the first capacitance portion C1. As described above, in the multilayer capacitor 1H, even in a case where cracks occur in the element assembly 2, it is possible to protect a part of the capacitance portions.

In the multilayer capacitor 1H of the electronic component device according to this embodiment, in a case where the distance between the edge 3f or 4f, which is located on an inner side in the second direction D2, of the electrode portion 3c or 4c of the first external electrode 3 or the second external electrode 4, and the end surface 2a or 2b on which the first external electrode 3 or the second external electrode 4 which includes the electrode portion 3c or 4c is disposed is set as BL, and the distance between the main surface 2d that is a mounting surface and the first capacitance portion C1 is set as BL, the following relationship is satisfied.

$$BL < GL \times 0.36$$

In a case of mounting the multilayer capacitor 1H on the circuit substrate and the like, when the circuit substrate is bent, cracks may occur in the element assembly 2 from positions corresponding to the edges 3f and 4f of the electrode portions 3c and 4c of the first external electrode 3 and/or the second external electrode 4. The cracks may occur at a predetermined angle from the positions corresponding to the edges 3f and 4f of the electrode portions 3c and 4c. In the multilayer capacitor 1H, since the relationship of $BL < GL \times 0.36$ is satisfied, even in a case where cracks occur in the element assembly 2, it is possible to suppress the cracks reach the first capacitance portion C1. As a result, it is possible to suppress the cracks from having an effect on the first capacitance portion C1. As a result, in the multilayer capacitor 1H, even in a case where cracks occur in the element assembly 2, it is possible to protect a part of the capacitance portions.

Hereinbefore, description has been given of the multilayer capacitor 1H according to the third embodiment, but the multilayer capacitor 1H is not limited to the above-described aspect, and various modifications can be made in a range not departing from the gist thereof.

In the embodiment, description has been given of an aspect in which the first connection conductor 5 includes the electrode portions 5a to 5c, and the electrode portions 5b and 5c are respectively disposed on the pair of main surfaces 2c and 2d as an example. However, as in the first embodiment (refer to FIG. 13A and FIG. 13B), the first connection conductor may be disposed only on the lateral surface 2e of the element assembly 2. The first connection conductor may be disposed to cover the entirety of a portion, which is exposed to the lateral surface 2e, of the connection portion 16b of the third internal electrodes 16. Similarly, the second connection conductor may be disposed only on the lateral surface 2f of the element assembly 2. The second connection conductor may be disposed to cover the entirety of a portion, which is exposed to the lateral surface 2f, of the connection portion 16c of the third internal electrode 16.

In addition, similar to the first embodiment (refer to FIG. 14A and FIG. 14B), the connection conductor may not be disposed on the outer surface of the element assembly 2.

Figure 20:
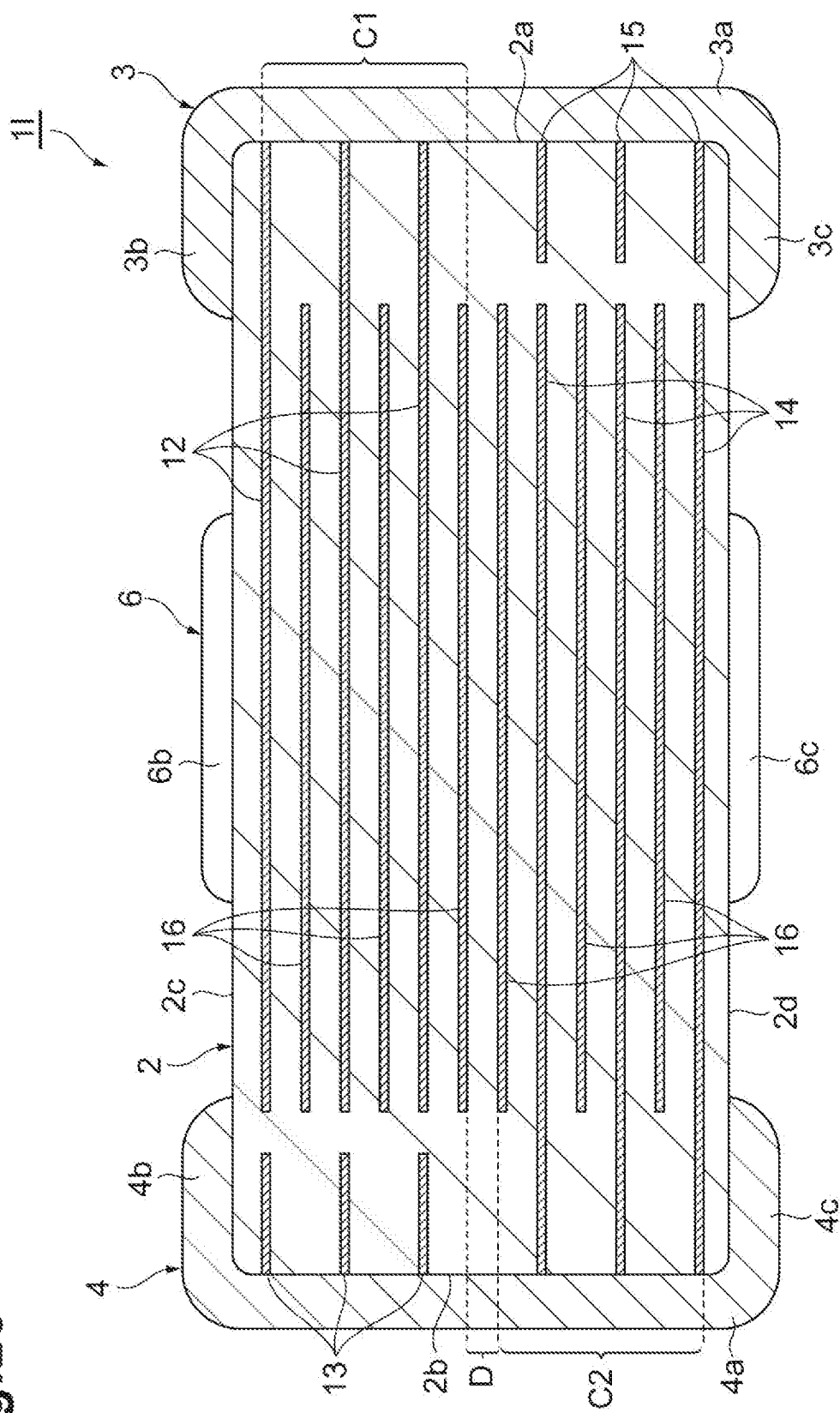
FIG. 20 is a view illustrating a cross-sectional configuration of a multilayer capacitor according to a modification example of the third embodiment.

In the embodiment, description has been given of an aspect in which the isolation portion D is provided between the first internal electrodes 12 and the second internal electrodes 14 as an example. However, as illustrated in FIG. 20, the isolation portion D may be provided between a pair of the third internal electrodes 16 which are opposite to each other in the first direction D1. In a multilayer capacitor 1I having this configuration, the isolation portion D is disposed between the third internal electrodes 16 which are electrically connected to each other, and thus electric field intensity at the isolation portion can be set to "zero". Accordingly, in the multilayer capacitor 1I, it is possible to further suppress insulation breakage and the like from occurring between the first capacitance portion C1 and the second capacitance portion C2. As a result, it is possible to further realize an improvement in the withstand voltage property.

In the embodiment, description has been given of an aspect in which the isolation portion D is constructed by laminating a plurality of the dielectric layers 10 as an example. However, the configuration of the isolation portion is not limited thereto. For example, the isolation portion may be constructed by forming a portion, in which the isolation portion is provided in the element assembly, with a material having specific dielectric constant smaller than that of a dielectric material of the dielectric layer 10.

Hereinbefore, description has been given of the embodiments of the invention, but the invention is not limited to the embodiments, and various modifications can be made in a range not departing from the gist of the invention.

In the embodiments, description has been given of an aspect in which the electrode portion 3c of the first external electrode 3 and the land electrode L1 are disposed to be opposite to each other, the electrode portion 4c of the second external electrode 4 and the land electrode L2 are disposed to be opposite to each other, the first external electrode 3 and the land electrode L1 are joined to each other with solder S1, and the second external electrode 4 and the land electrode L2 are joined to each other with solder S2 as an example. However, the first external electrode 3 and the land electrode L1 may be electrically connected to each other, for example, through a metal terminal having an L-shape. Similarly, the second external electrode 4 and the land electrode L2 may be electrically connected to each other through the metal terminal.

In the embodiments, description has been given of an aspect in which the first internal electrodes 12 and 12A, the second internal electrodes 14 and 14A, and the third internal electrodes 16 are perpendicular to the lateral surfaces 2e and 2f of the element assembly 2 which are mounting surfaces, and extend along an opposing direction of the pair of end surfaces 2a and 2b as an example. That is, description has been given of an aspect in which a lamination direction of the dielectric layer 10 is the opposing direction of the pair of main surfaces 2c and 2d as an example. However, the first internal electrode, the second internal electrode, and the third internal electrode may be perpendicular to the main surfaces 2c and 2d of the element assembly 2, and may extend along the opposing direction of the pair of end surfaces 2a and 2b.

In the embodiments, description has been given of an aspect in which the first external electrode 3 includes the electrode portions 3a and 3e as an example. However, the first external electrode 3 may include at least the electrode portions 3a and 3c. Similarly, the second external electrode 4 may include at least the electrode portions 4a and 4c.

In the embodiments, description has been given of an aspect in which the electronic component device includes the multilayer capacitor as an example. However, the invention may be only the multilayer capacitor.

What is claimed is:

1. A multilayer capacitor, comprising:
   an element assembly including a pair of end surfaces which are opposite to each other, a pair of main surfaces which are opposite to each other, and a pair of lateral surfaces which are opposite to each other;
   a first external electrode and a second external electrode which are respectively disposed on pair-of-end-surface sides; and
   a plurality of internal electrodes which are disposed in the element assembly, the plurality of internal electrodes including:
      a first internal electrode that is disposed on one main surface side at an inside of the element assembly and electrically connected to the first external electrode;
      a second internal electrode that is disposed on the other main surface side at the inside of the element assembly and electrically connected to the second external electrode; and
      a plurality of third internal electrodes that are disposed to be respectively opposite to the first internal electrode and the second internal electrode, include a connection electrically connected to a first connection conductor and a connection electrically connected to a second connection conductor, and are electrically connected to the first connection conductor and the second connection conductor by the two connections;
   a first capacitance portion that is constituted by the first internal electrode and the third internal electrodes; and
   a second capacitance portion that is constituted by the second internal electrode and the third internal electrodes, the first capacitance portion and the second capacitance portion being electrically connected in series.

2. The multilayer capacitor according to claim 1, wherein the first internal electrode and the second internal electrode are disposed at the same position in an opposing direction of the pair of main surfaces.

3. The multilayer capacitor according to claim 1, wherein a pair of the third internal electrodes are disposed to be opposite to each other between the first internal electrode and the second internal electrode.

4. The multilayer capacitor according to claim 3, wherein the third internal electrodes are further disposed between the pair of third internal electrodes disposed to be opposite to each other.

5. The multilayer capacitor according to claim 1, further comprising:
   a dummy electrode that is disposed at the same layer as a layer of at least one internal electrode among the first internal electrode, the second internal electrode, and the third internal electrodes to be spaced away from the internal electrode, and is connected to an external electrode different from the first external electrode or the second external electrode to which the internal electrode is connected.

6. A multilayer capacitor, comprising:
   an element assembly including a pair of end surfaces which are opposite to each other, a pair of main surfaces which are opposite to each other, and a pair of lateral surfaces which are opposite to each other;
   a first external electrode and a second external electrode which are respectively disposed on pair-of-end-surface sides;
   a plurality of internal electrodes which are disposed in the element assembly, the plurality of internal electrodes including:
      a first internal electrode that is electrically connected to the first external electrode;
      a second internal electrode that is electrically connected to the second external electrode; and
      a plurality of third internal electrodes that include a connection electrically connected to a first connection conductor and a connection electrically connected to a second connection conductor, and are electrically connected to the first connection conductor and the second connection conductor by the two connections:
   a first capacitance portion that is constituted by the first internal electrode and the third internal electrodes which are disposed in a region on one main surface side at an inside of the element assembly;
   a second capacitance portion that is constituted by the second internal electrode and the third internal electrodes which are disposed in a region on the other main surface side at the inside of the element assembly, the first capacitance portion and the second capacitance portion being electrically connected in series; and
   an isolation portion that is provided between the first capacitance portion and the second capacitance portion in an opposing direction of the pair of main surfaces to isolate the first capacitance portion and the second capacitance portion,
   wherein electric field intensity at the isolation portion is smaller than electric field intensity of the first internal electrode and the third internal electrodes at the first capacitance portion, and electric field intensity of the second internal electrode and the third internal electrodes at the second capacitance portion.

7. The multilayer capacitor according to claim 6, wherein the isolation portion is disposed between the pair of third internal electrodes which are opposite to each other in the opposing direction.

8. The multilayer capacitor according to claim 6, wherein the other main surface of the element assembly is a mounting surface,
   the connection conductor is disposed on pair-of-lateral-surface sides of the element assembly,
   each of the first external electrode, the second external electrode, and the connection conductor includes an electrode portion that is disposed on the mounting surface, and
   a thickness of the electrode portion of the connection conductor in the opposing direction is smaller than a thickness of the electrode portion of each of the first external electrode and the second external electrode in the opposing direction.

9. The multilayer capacitor according to claim 8, wherein when a distance between an edge, which is located on an inner side in an opposing direction of the pair of end surfaces, of the electrode portion of each of the first external electrode and the second external electrode, and an end surface, on which the first external electrode or the second external electrode that includes the electrode portion is disposed, in the pair of end surfaces is set as BL, and a distance between the mounting surface and the first capacitance portion is set as GL, a relationship of BL<GL×0.36 is satisfied.

10. An electronic component device, comprising:
a circuit substrate including an electrical circuit; and
a multilayer capacitor that is mounted on the circuit substrate, the multilayer capacitor including:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and
a plurality of internal electrodes which are disposed in the element assembly, the plurality of internal electrodes including:
a first internal electrode that is electrically connected to the first external electrode;
a second internal electrode that is electrically connected to the second external electrode; and
a plurality of third internal electrodes that include a connection electrically connected to a first connection conductor and a connection electrically connected to a second connection conductor, and are electrically connected to the first connection conductor and the second connection conductor by the two connections;
a first capacitance portion that is constituted by the first internal electrode and the third internal electrodes; and
a second capacitance portion that is constituted by the second internal electrode and the third internal electrodes, the first capacitance portion and the second capacitance portion being electrically connected in series,
wherein only the first external electrode and the second external electrode of the multilayer capacitor are electrically connected to the electrical circuit of the circuit substrate.

11. The electronic component device according to claim 10,
wherein between one main surface and the other main surface of the element assembly, the other main surface is a mounting surface,
the connection conductor is disposed at least on one lateral surface side of the element assembly,
each of the first external electrode, the second external electrode, and the connection conductor includes an electrode portion that is disposed on the mounting surface, and
a thickness of the electrode portion of each of the first external electrode and the second external electrode in an opposing direction of the pair of main surfaces is greater than a thickness of the electrode portion of the connection conductor in the opposing direction.

12. The electronic component device according to claim 10,
wherein between one main surface and the other main surface of the element assembly, the other main surface is a mounting surface, and
the connection conductor is disposed at least on one lateral surface side of the element assembly.

13. The electronic component device according to claim 10,
wherein the connection conductor is a via-conductor that is disposed at an inside of the element assembly.

14. The electronic component device according to claim 10,
wherein the first internal electrode and the second internal electrode are disposed at the same position in an opposing direction of the pair of main surfaces, and
the third internal electrodes are disposed to be respectively opposite to the first internal electrode and the second internal electrode.

15. The electronic component device according to claim 10,
wherein the first internal electrode is disposed on one main surface side at an inside of the element assembly,
the second internal electrode is disposed on the other main surface side at the inside of the element assembly, and
the third internal electrodes are disposed to be respectively opposite to the first internal electrode and the second internal electrode.

16. A multilayer capacitor, comprising:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and
a plurality of internal electrodes which are disposed in the element assembly, the plurality of internal electrodes including:
a first internal electrode that is electrically connected to the first external electrode;
a second internal electrode that is electrically connected to the second external electrode; and
a plurality of third internal electrodes that include a connection electrically connected to a first connection conductor and a connection electrically connected to a second connection conductor, and are electrically connected to the first connection conductor and the second connection conductor by the two connections:
a first capacitance portion that is constituted by the first internal electrode and the third internal electrodes; and
a second capacitance portion that is constituted by the second internal electrode and the third internal electrodes, the first capacitance portion and the second capacitance portion being electrically connected in series,
wherein a distance between the first internal electrode and the third internal electrodes, which oppose each other in an opposing direction of the pair of main surfaces, and a distance between the second internal electrode and the third internal electrodes, which oppose each other in the opposing direction, are shorter than a distance between the first capacitance portion and the second capacitance portion in the opposing direction.

17. A multilayer capacitor, comprising:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and a plurality of internal electrodes which are disposed in the element assembly, the plurality of internal electrodes including:
   a first internal electrode that is disposed on one main surface side at an inside of the element assembly and electrically connected to the first external electrode;
   a second internal electrode that is disposed on the other main surface side at the inside of the element assembly and electrically connected to the second external electrode; and
   a plurality of third internal electrodes that are disposed to be respectively opposite to the first internal electrode and the second internal electrode, include a connection electrically connected to a first connection conductor and a connection electrically connected to a second connection conductor, and are electrically connected to the first connection conductor and the second connection conductor by the two connections;
a first capacitance portion that is constituted by the first internal electrode and the third internal electrodes; and
a second capacitance portion that is constituted by the second internal electrode and the third internal electrodes, the first capacitance portion and the second capacitance portion being electrically connected in series,
wherein a distance between the first internal electrode and the third internal electrodes, which oppose each other in an opposing direction of the pair of main surfaces, and a distance between the second internal electrode and the third internal electrodes, which oppose each other in the opposing direction, are shorter than a distance in the opposing direction at a closest point between the first internal electrode and the second internal electrode.

18. The multilayer capacitor according to claim 1,
wherein the other main surface of the element assembly is a mounting surface,
the connection conductor is disposed on pair-of-lateral-surface sides of the element assembly,
each of the first external electrode, the second external electrode, and the connection conductor includes an electrode portion that is disposed on the mounting surface, and
a thickness of the electrode portion of the connection conductor in an opposing direction of the pair of main surfaces is smaller than a thickness of the electrode portion of each of the first external electrode and the second external electrode in the opposing direction.

19. The multilayer capacitor according to claim 1,
wherein the other main surface of the element assembly is a mounting surface,
each of the first external electrode and the second external electrode includes an electrode portion that is disposed on the mounting surface,
when a distance between an edge, which is located on an inner side in an opposing direction of the pair of end surfaces, of the electrode portion of each of the first external electrode and the second external electrode, and an end surface, on which the first external electrode or the second external electrode that includes the electrode portion is disposed, in the pair of end surfaces is set as BL, and a distance between the mounting surface and the first capacitance portion is set as GL, a relationship of $BL<GL\times 0.36$ is satisfied.

20. The electronic component device according to claim 10, wherein a distance between the first internal electrode and the third internal electrodes, which oppose each other in an opposing direction of the pair of main surfaces, and a distance between the second internal electrode and the third internal electrodes, which oppose each other in the opposing direction, are shorter than a distance between the first capacitance portion and the second capacitance portion in the opposing direction.

21. The electronic component device according to claim 10, wherein a distance between the first internal electrode and the third internal electrodes, which oppose each other in an opposing direction of the pair of main surfaces, and a distance between the second internal electrode and the third internal electrodes, which oppose each other in the opposing direction, are shorter than a distance in the opposing direction between the first internal electrode and the second internal electrode.

22. The electronic component device according to claim 15,
wherein the other main surface of the element assembly is a mounting surface,
each of the first external electrode and the second external electrode includes an electrode portion that is disposed on the mounting surface,
when a distance between an edge, which is located on an inner side in an opposing direction of the pair of end surfaces, of the electrode portion of each of the first external electrode and the second external electrode, and an end surface, on which the first external electrode or the second external electrode that includes the electrode portion is disposed, in the pair of end surfaces is set as BL, and a distance between the mounting surface and the first capacitance portion is set as GL, a relationship of $BL<GL\times 0.36$ is satisfied.

23. A multilayer capacitor, comprising:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and
a plurality of internal electrodes which are disposed in the element assembly, the plurality of internal electrodes including:
   a first internal electrode that is electrically connected to the first external electrode;
   a second internal electrode that is electrically connected to the second external electrode; and
   a plurality of third internal electrodes that are electrically connected to each other by a connection conductor;
a first capacitance portion that is constituted by the first internal electrode and the third internal electrodes;
a second capacitance portion that is constituted by the second internal electrode and the third internal electrodes, the first capacitance portion and the second capacitance portion being electrically connected in series; and
a dummy electrode that is disposed at the same layer as a layer of at least one internal electrode among the first internal electrode, the second internal electrode, and the third internal electrodes to be spaced away from the internal electrode, and is connected to an external electrode different from the first external electrode or the second external electrode to which the internal electrode is connected.

24. A multilayer capacitor, comprising:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and
a plurality of internal electrodes which are disposed in the element assembly, the plurality of internal electrodes including:
   a first internal electrode that is electrically connected to the first external electrode;
   a second internal electrode that is electrically connected to the second external electrode; and
   a plurality of third internal electrodes that are electrically connected to each other by a connection conductor;
a first capacitance portion that is constituted by the first internal electrode and the third internal electrodes; and
a second capacitance portion that is constituted by the second internal electrode and the third internal electrodes, the first capacitance portion and the second capacitance portion being electrically connected in series,
wherein the other main surface of the element assembly is a mounting surface,
the connection conductor is disposed on pair-of-lateral-surface sides of the element assembly,
each of the first external electrode, the second external electrode, and the connection conductor includes an electrode portion that is disposed on the mounting surface, and
a thickness of the electrode portion of the connection conductor in an opposing direction of the pair of main surfaces is smaller than a thickness of the electrode portion of each of the first external electrode and the second external electrode in the opposing direction.

25. A multilayer capacitor, comprising:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and
a plurality of internal electrodes which are disposed in the element assembly, the plurality of internal electrodes including:
   a first internal electrode that is electrically connected to the first external electrode;
   a second internal electrode that is electrically connected to the second external electrode; and
   a plurality of third internal electrodes that are electrically connected to each other by a connection conductor;
a first capacitance portion that is constituted by the first internal electrode and the third internal electrodes; and
a second capacitance portion that is constituted by the second internal electrode and the third internal electrodes, the first capacitance portion and the second capacitance portion being electrically connected in series,
wherein the other main surface of the element assembly is a mounting surface,
each of the first external electrode and the second external electrode includes an electrode portion that is disposed on the mounting surface,
when a distance between an edge, which is located on an inner side in an opposing direction of the pair of end surfaces, of the electrode portion of each of the first external electrode and the second external electrode, and an end surface, on which the first external electrode or the second external electrode that includes the electrode portion is disposed, in the pair of end surfaces is set as BL, and a distance between the mounting surface and the first capacitance portion is set as GL, a relationship of BL<GL×0.36 is satisfied.

26. A multilayer capacitor, comprising:
an element assembly including a pair of end surfaces which are opposite to each other, a pair of main surfaces which are opposite to each other, and a pair of lateral surfaces which are opposite to each other;
a first external electrode and a second external electrode which are respectively disposed on pair-of-end-surface sides; and
a plurality of internal electrodes which are disposed in the element assembly, the plurality of internal electrodes including:
   a first internal electrode that is electrically connected to the first external electrode;
   a second internal electrode that is electrically connected to the second external electrode; and
   a plurality of third internal electrodes that are electrically connected to each other by a via conductor disposed in the element;
a first capacitance portion that is constituted by the first internal electrode and the third internal electrodes; and
a second capacitance portion that is constituted by the second internal electrode and the third internal electrodes, the first capacitance portion and the second capacitance portion being electrically connected directly in series by via conductor.

* * * * *